(12) United States Patent
Yan et al.

(10) Patent No.: US 10,312,268 B2
(45) Date of Patent: Jun. 4, 2019

(54) DISPLAY DEVICE

(71) Applicant: InnoLux Corporation, Miao-Li County (TW)

(72) Inventors: Tzu-Min Yan, Miao-Li County (TW); Ming-Chang Lin, Miao-Li County (TW); Kuan-Feng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/876,383

(22) Filed: Jan. 22, 2018

(65) Prior Publication Data

US 2018/0145094 A1    May 24, 2018

Related U.S. Application Data

(63) Continuation of application No. 15/363,289, filed on Nov. 29, 2016, now Pat. No. 9,911,762.

(Continued)

(30) Foreign Application Priority Data

May 18, 2016 (TW) .............................. 105115275 A

(51) Int. Cl.
*H01L 27/12* (2006.01)
*H01L 29/786* (2006.01)
*G02F 1/1333* (2006.01)

(52) U.S. Cl.
CPC .... *H01L 27/1251* (2013.01); *G02F 1/133345* (2013.01); *H01L 27/1225* (2013.01);

(Continued)

(58) Field of Classification Search
CPC .................................................. H01L 27/1251
See application file for complete search history.

(56) References Cited

U.S. PATENT DOCUMENTS

| 8,829,511 B2 | 9/2014 | Hsieh et al. |
| 9,129,927 B2 | 9/2015 | Gupta et al. |

(Continued)

FOREIGN PATENT DOCUMENTS

| TW | 554538 | 9/2003 |
| TW | 201251026 | 12/2012 |
| TW | 201411851 | 3/2014 |

OTHER PUBLICATIONS

Chinese language office action dated Nov. 16, 2016, issued in application No. TW 105115275.

*Primary Examiner* — Eugene Lee
(74) *Attorney, Agent, or Firm* — McClure, Qualey & Rodack, LLP

(57) ABSTRACT

A display device is provided, which includes a substrate including a pixel region; a metal oxide semiconductor transistor disposed over the substrate and including: a metal oxide semiconductor layer, a first gate electrode overlapping with the metal oxide semiconductor layer; and a gate insulating layer disposed between the metal oxide semiconductor layer and the first gate electrode, and the gate insulating layer having a first opening, wherein the first opening and the pixel region overlap; a second insulating layer disposed over the metal oxide semiconductor layer and having a via and a second opening, wherein the second opening and the pixel region overlap; and a pixel electrode electrically connected to the metal oxide semiconductor layer through the via.

18 Claims, 33 Drawing Sheets

Related U.S. Application Data

(60) Provisional application No. 62/262,430, filed on Dec. 3, 2015.

(52) U.S. Cl.
CPC .... *H01L 27/1248* (2013.01); *H01L 29/78633* (2013.01); *H01L 29/78648* (2013.01); *H01L 29/78696* (2013.01); *G02F 2201/40* (2013.01)

(56) References Cited

U.S. PATENT DOCUMENTS

| | | |
|---|---|---|
| 9,147,719 B2 | 9/2015 | Kim et al. |
| 2004/0141130 A1 | 7/2004 | Kawata et al. |
| 2010/0072480 A1 | 3/2010 | Yoo et al. |
| 2010/0182223 A1 | 7/2010 | Choi et al. |
| 2011/0049523 A1 | 3/2011 | Choi et al. |
| 2011/0057194 A1 | 3/2011 | Kim et al. |
| 2013/0037806 A1 | 2/2013 | Hayashi et al. |
| 2014/0291624 A1* | 10/2014 | Kim .................... H01L 27/3248 257/40 |
| 2014/0326993 A1 | 11/2014 | Oikawa et al. |
| 2016/0091744 A1 | 3/2016 | Lee et al. |
| 2016/0254337 A1* | 9/2016 | Choi ................... H01L 27/3272 257/40 |
| 2017/0236842 A1* | 8/2017 | Matsuda ............. H01L 27/1222 257/43 |
| 2017/0278909 A1* | 9/2017 | Jeon .................... A61B 5/1171 |
| 2017/0309651 A1* | 10/2017 | Kim ...................... G02F 1/1345 |

\* cited by examiner

DISPLAY DEVICE

CROSS REFERENCE TO RELATED APPLICATIONS

This application is a Continuation of U.S. patent application Ser. No. 15/363,289, filed on Nov. 29, 2016 and entitled "Display device", now U.S. Pat. No. 9,911,762, which claims priority of Taiwan Patent Application No. 105115275, filed on May 18, 2016, and claims the benefit of U.S. Provisional Application No. 62/262,430, filed on Dec. 3, 2015, the entirety of which is incorporated by reference herein.

BACKGROUND

Technical Field

The disclosure relates to a display device, and in particular it relates to an array substrate structure of the display device.

Description of the Related Art

The processes for manufacturing a general liquid-crystal display of thin film transistor (TFT-LCD) can be classified to three major parts. The tint part is called the array process, which manufactures a color filter substrate and an array substrate for driving and display signals. The second part is called the cell process, which controls, fills, and seals liquid-crystal in a cell between the array substrate and the color filter substrate. The third part is called the module process, which assembles a polarizer, a backlight module, and a liquid-crystal panel. In the array process, a silicon oxide layer and a silicon nitride layer are often selected as insulating layers between different conductive layers. However, the silicon oxide layer and the silicon nitride layer have different refractive indexes, so the interface thereof can easily partially reflect light. In other words, the light cannot totally pass through the interface of the silicon oxide layer and the silicon nitride layer. As such, the aperture ratio of the aperture region in the pixels of the array substrate will be reduced.

Accordingly, a novel array substrate structure is required for overcoming the above problems.

BRIEF SUMMARY

One embodiment of the disclosure provides a display device, including: a substrate including a pixel region; a metal oxide semiconductor transistor disposed over the substrate and including: a metal oxide semiconductor layer, a first gate electrode overlapping with the metal oxide semiconductor layer; and a gate insulating layer disposed between the metal oxide semiconductor layer and the first gate electrode, and the gate insulating layer having a first opening, wherein the first opening and the pixel region overlap; a second insulating layer disposed over the metal oxide semiconductor layer and having a via and a second opening, wherein the second opening and the pixel region overlap; and a pixel electrode electrically connected to the metal oxide semiconductor layer through the via.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

The polysilicon transistor has a high switch-on current ($I_{on}$) and a high carrier mobility, and the metal oxide semiconductor transistor has a low switch-off current ($T_{off}$) and excellent uniformity. The polysilicon transistor and the metal oxide semiconductor transistor are integrated according to the properties to be both used in a display panel of the disclosure. For example, the polysilicon transistor and the metal oxide semiconductor transistor are both used in a driving circuit, which can be vertically stacked (or horizontally arranged) and electrically connected to form the desired circuit structure. Alternatively, the polysilicon transistor and the metal oxide semiconductor transistor are collocated in the pixel region to achieve switch, compensating, or the like circuit design.

In following embodiments, the polysilicon transistor is arranged in the driving circuit, and the metal oxide semiconductor transistor is arranged in the pixel region to include both the advantages. The polysilicon transistor is electrically connected to the metal oxide semiconductor transistor.

Figure 1:
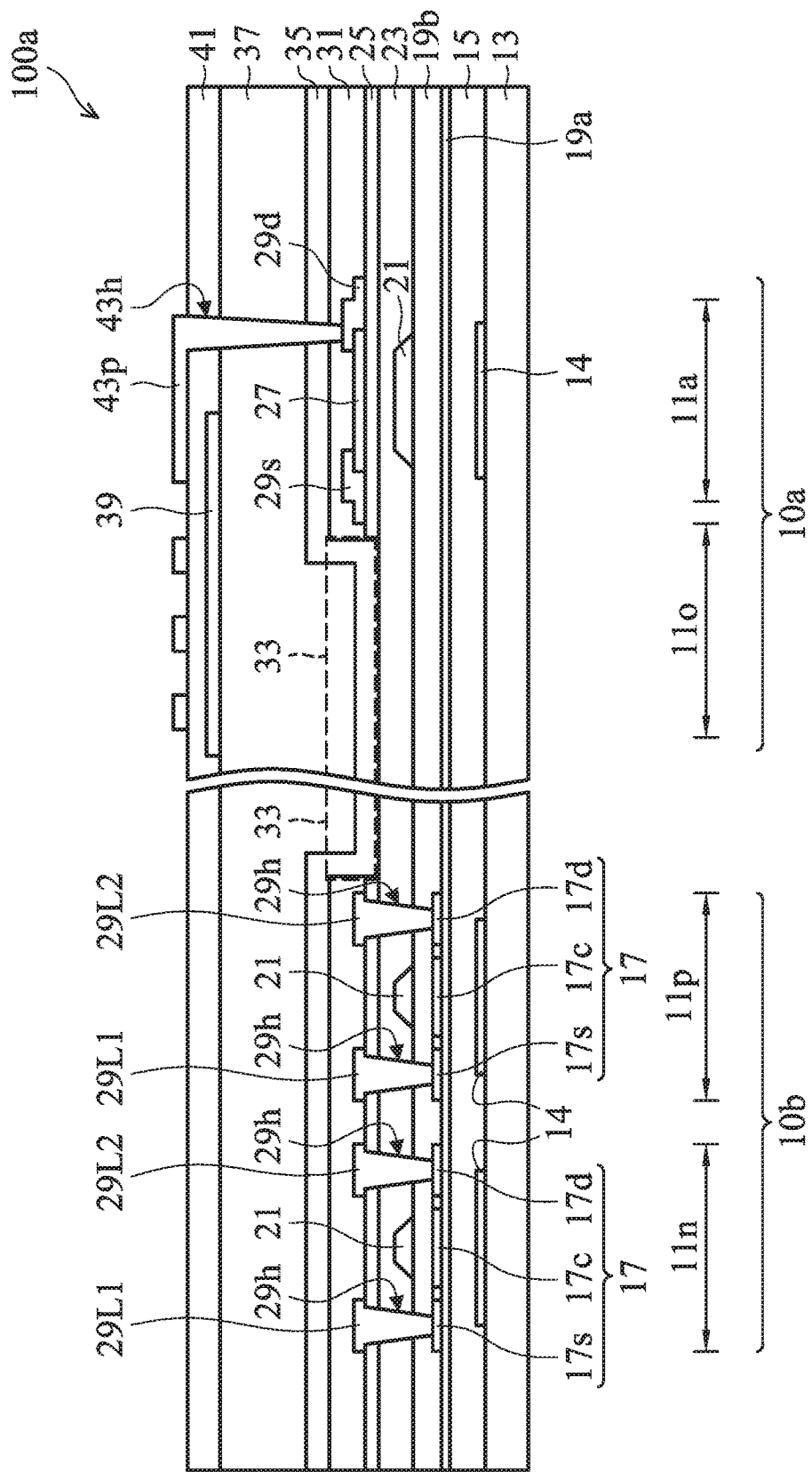
FIGS. 1 to 8 and 12 to 19 are cross-sectional views of array substrate structures in embodiments of the disclosure.

In one embodiment, a cross-sectional view of an array substrate structure 100a is shown in FIG. 1. The array substrate structure 100a is divided to a plurality of pixel regions 10a and a driving circuit 10b. Each of the pixel regions 10a includes a metal oxide semiconductor transistor 11a and an aperture region 11o, and the driving circuit 10b includes an n-type polysilicon transistor 11n and a p-type polysilicon transistor 11p. The metal oxide semiconductor transistor 11a disposed over the substrate. The metal oxide semiconductor transistor 11a comprises a metal oxide semiconductor layer, a first gate electrode and a silicon oxide insulating layer. In another embodiment, the driving circuit 10b may include only the n-type polysilicon transistor 11n or only the p-type polysilicon transistor 11p if necessary. The array substrate structure 100a includes a substrate 13, which can comprise a transparent material such as glass or plastic, and is not limited thereto. Light shielding layers 14 are disposed over the substrate 13 to correspond to the polysilicon layers 17 of the n-type polysilicon transistor 11n and the p-type polysilicon transistor 11p. The light shielding layer 14 is also disposed over the substrate 13 to correspond to the metal oxide semiconductor layer 27 (of the metal oxide semiconductor transistor 11a). The term "disposed over" may include embodiments in which the first and second features are formed in direct contact, and may also include embodiments in which additional features may be formed between the first and second features, such that the first and second features may not be in direct contact. The light shielding layers 14 can comprise of black resin or metal such as chromium, and is not limited thereto. The light shielding layers 14 can be formed by sputtering and then patterned by lithography and etching. A buffer layer 15 is disposed over the light shielding layers 14. The buffer layer 15 can be formed by chemical vapor deposition (CVD) and can comprise silicon nitride, and is not limited thereto. A buffer layer 19a is disposed over the buffer layer 15. The buffer layer 19a can be formed by CVD and can comprise silicon oxide, and is not limited thereto. Polysilicon layers 17 are disposed over the buffer layer 19a to correspond to the polysilicon transistors 11n and 11p. The polysilicon layers 17 can comprise low-temperature polysilicon (LIPS), and is not limited thereto. In one embodiment, a light-shielding photoresist pattern defined by lithography is used to protect the middle part of the polysilicon layers 17 (e.g. a channel regions 17c), and ions are implanted at both sides of the channel regions 17c to define source regions 17s and drain regions 17d. The photoresist pattern can optionally be removed by wet stripping or dry stripping.

A buffer layer 19b is disposed over the polysilicon layers 17 and the buffer layer 19a. The buffer layer 19b can be formed by CVD and can comprise silicon oxide, and is not limited thereto. Gate electrodes 21 are disposed over the buffer layer 19b, and the gate electrodes 21 can comprise metal, and are not limited thereto. The gate electrodes can be formed by sputtering and then patterned by lithography and etching. For the polysilicon transistors 11n and 11p, the gate electrodes 21 correspond to the channel regions 17c, and the gate insulating layer between the channel regions 17c and the gate electrodes 21 is the buffer layer 19b. An ILD (inter layer dielectric) layer 23 is disposed over the gate electrodes 21 and the buffer layer 19b. The ILD layer 23 can be formed by CVD and can comprise silicon nitride, and is not limited thereto. An ILD layer 25 is disposed over the ILD layer 23. The ILD layer 25 can be formed by CVD and can comprise silicon oxide, and is not limited thereto.

A metal oxide semiconductor layer 27 is disposed over the ILD layer 25 to correspond to the gate electrode 21 of the metal oxide semiconductor transistor 11a. The metal oxide semiconductor layer 27 can be indium gallium zinc oxide (IGZO), and is not limited thereto. The metal oxide semiconductor layer 27 can be formed by sputtering and then patterned by lithography and etching. Note that the channel region of the metal oxide semiconductor layer 27 should not be exposed to light or contacts any silicon nitride layer in order not to be transferred from semiconductor to conductor. For the metal oxide semiconductor transistor 11a, the gate insulating layer between the channel layer (metal oxide semiconductor layer 27) and the gate electrode 21 is the ILD layers 23 and 25, e.g. a bi-layered structure of silicon oxide and silicon nitride, wherein the silicon oxide layer is disposed between the silicon nitride layer and the metal oxide semiconductor layer 27. Note that if the arranged order of the gate insulating layer is exchanged, e.g. the silicon nitride layer is disposed between the silicon oxide layer and the metal oxide semiconductor layer 27, the electrical performance of the metal oxide semiconductor layer 27 will be degraded due to contacting the silicon nitride layer.

Source lines 29L1, drain lines 29L2, a source electrode 29s, and a drain electrode 29d are formed on the ILD layer 25. The source lines 29L1 are disposed over the source regions 17s, and the source lines 29L1 are connected to the source regions 17s by vias 29h through the ILD layer 25, the ILD layer 23, and the buffer layer 19b. The drain lines 29L2 are disposed over the drain regions 17d, and the drain lines 29L2 are connected to the drain regions 17d by vias 29h through the ILD layer 25, the ILD layer 23, and the buffer layer 19b. The source electrode 29s and the drain electrode 29d are disposed over both sides of the metal oxide semiconductor layer 27 respectively. The vias 29h can be prepared by forming holes through the ILD layer 25, the ILD layer 23, and the buffer layer 19b by lithography and etching. Metal is filled into the holes and a metal layer is then formed on the ILD layer 25. The metal layer is then patterned by lithography and etching to define the source lines 29L1, the drain lines 29L2, the source electrode 29s, and the drain electrode 29d.

An insulating layer 31 is disposed over the ILD layer 25, the metal oxide semiconductor layer 27, the source lines 29L1, the drain lines 29L2, the source electrode 29s, and the drain electrode 29d. The insulating layer 31 can be formed by CVD and can comprise silicon oxide, and is not limited thereto. The insulating layer 31 and the ILD layer 25 have an opening 33 corresponding to the aperture region 11o. The opening 33 can be formed by lithography and etching. Note that the exposure step in the lithography can be performed by exposing from the bottom, in which the light shielding layers 14, the source lines 29L1, the drain lines 29L2, the source electrode 29s, and the drain electrode 29d serve as the photomask, thereby omitting a photomask to reduce the cost. After the lithography by exposing from the bottom followed by etching, edges of the silicon oxide layers such as the insulating layer 31 and the ILD layer 25 will be corresponded to an edge of the mask. Because the gate electrode 21 of the metal oxide semiconductor transistor 11a may shield the light, the light shielding layer 14 in the metal oxide semiconductor transistor 11a can be optionally omitted. In some embodiments, the opening 33 may extend downward to penetrate through the ILD layer 23, the buffer layer 19b, the buffer layer 19a, and even the buffer layer 15.

An insulating layer 35 is disposed over the insulating layer 31 and in the opening 33. The insulating layer 35 can be formed by CVD and can comprise silicon nitride, and is not limited thereto. In this embodiment, the insulating layer 35 may directly contact the ILD layer 23 through the opening 33. An organic insulating layer 37 is disposed over the insulating layer 35, which can be formed by spin-on coating to provide an insulating surface for stacking films subsequently. A common electrode 39 is disposed over the organic insulating layer 37, which mainly corresponds to the pixel region 10a. The common electrode 39 can comprise transparent conductive material such as indium tin oxide (ITO), and is not limited thereto. The common electrode 39 can be formed by sputtering and then patterned by lithography and etching. An insulating layer 41 is disposed over the common electrode 39 and the organic insulating layer 37. The insulating layer 41 can be formed by CVD and can comprise silicon nitride, and is not limited thereto.

A pixel electrode 43p is disposed over the insulating layer 41. A part of the pixel electrode 43p is disposed over the drain electrode 29d, and the pixel electrode 43p is connected to the drain electrode 29d by a via 43h penetrating through the insulating layer 41, the organic insulating layer 37, the insulating layer 35, and the insulating layer 31. The via 43h can be prepared by forming a hole through the insulating layer 41, the organic insulating layer 37, the insulating layer 35, and the insulating layer 31 by lithography and etching. The transparent conductive material such as ITO is filled into the hole and formed a transparent conductive material layer on the insulating layer 41. The transparent conductive material layer is then patterned by lithography and etching to define the pixel electrode 43p.

In FIG. 1, the polysilicon transistors 11n and 11p in the driving circuit 10b belong to a top gate structure, and the metal oxide semiconductor transistor 11a in the pixel region 10a belongs to a bottom gate structure. The silicon oxide layer (e.g. the insulating layer 31) over the metal oxide semiconductor layer 27, and silicon oxide layer (e.g. the ILD layer 25) between the metal oxide semiconductor layer 27 and the gate electrode 21 have an opening 33 corresponding to the aperture region 11o, as shown in FIG. 1. As such, the interface between the silicon oxide layer and the silicon nitride layer in the aperture region 11o can be reduced, thereby improving the light transmittance of the array substrate structure 100a. Note that the opening 33 can be formed not only in the aperture region 11o of the pixel region 10a but also in the driving circuit 10b determined by the photomask design.

Figure 2:
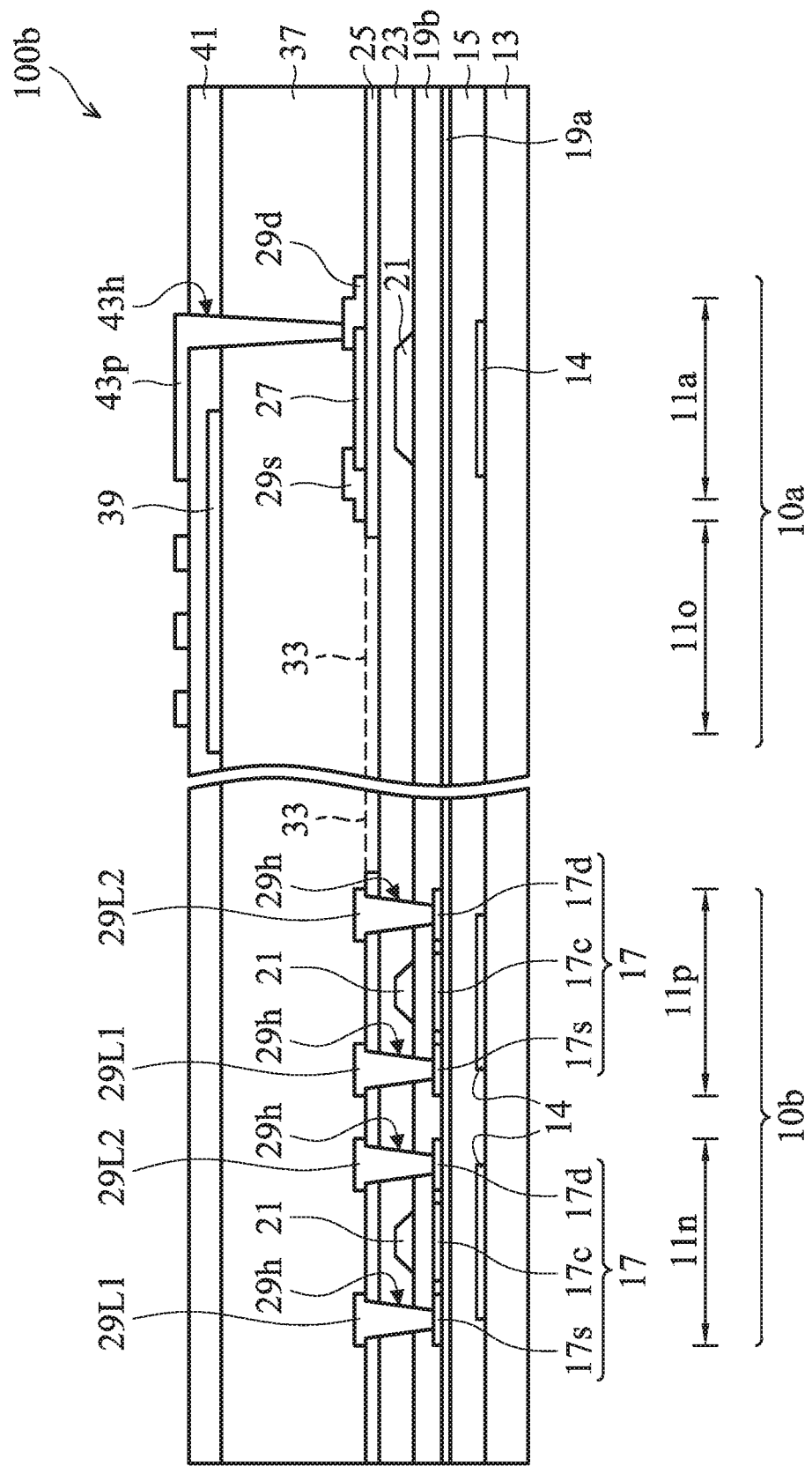

In the following embodiments, if the material and the formation method of the elements with the same numerals are similar to that of the above elements, details will not be described. In one embodiment, a cross-sectional view of an array substrate structure 100b is shown in FIG. 2. In FIG. 2, the relative locations of the pixel region 10a, the driving circuit 10b, the metal oxide semiconductor transistor 11a, the aperture region 11o, and the polysilicon transistors 11n and 11p are similar to those in FIG. 1. Light shielding layers 14 are disposed over the substrate 13 to correspond to the polysilicon layers 17 of the n-type polysilicon transistor 11n and the p-type polysilicon transistor 11p. The light shielding layer 14 is also disposed over the substrate 13 to correspond to the metal oxide semiconductor layer 27 of the metal oxide semiconductor transistor 11a. A buffer layer 15 is disposed over the light shielding layers 14, and a buffer layer 19a is disposed over the buffer layer 15. Polysilicon layers 17 (such as the source regions 17s, the channel regions 17c, and the drain regions 17d) are disposed over the buffer layer 19a to correspond to the polysilicon transistors 11n and 11p. A buffer layer 19b is disposed over the polysilicon layers 17 and the buffer layer 19a, and the gate electrodes 21 are disposed over the buffer layer 19b. For the polysilicon transistors 11n and 11p, the gate electrodes 21 are disposed over the channel regions 17c, and a gate insulation layer such as the buffer layer 19b is disposed therebetween.

An ILD layer 23 is disposed over the gate electrodes 21 and the buffer layer 19b, and an ILD layer 25 is disposed over the ILD layer 23. A metal oxide semiconductor layer 27 is disposed over the ILD layer 25 to correspond to the gate electrode 21 of the metal oxide semiconductor transistor 11a. For the metal oxide semiconductor transistor 11a, the gate insulating layer between the channel layer (metal oxide semiconductor layer 27) and the gate electrode 21 is the ILD layers 23 and 25. Source lines 29L1, drain lines 29L2, a source electrode 29s, and a drain electrode 29d are formed on the ILD layer 25. The source lines 29L1 are disposed over the source regions 17s, and the source lines 29L1 are connected to the source regions 17s by vias 29h penetrating through the ILD layer 25, the ILD layer 23, and the buffer layer 19b. The drain lines 29L2 are disposed over the drain regions 17d, and the drain lines 29L2 are connected to the drain regions 17d by vias 29h penetrating through the ILD layer 25, the ILD layer 23, and the buffer layer 19b. The source electrode 29s and the drain electrode 29d are disposed over both sides of the petal oxide semiconductor layer 27.

The ILD layer 25 has an opening 33 corresponding to the aperture region 11o. The opening 33 can be formed by lithography and etching. Note that the exposure step in the lithography can be exposing from the bottom, in which the light shielding layers 14, the source lines 29L1, the drain lines 29L2, the source electrode 29s, and the drain electrode 29d serve as the photomask, thereby omitting a photomask to reduce the cost. After the lithography by exposing from the bottom and etching, an edge of the ILD layer 25 (silicon oxide layer) will be corresponded to an edge of the mask. Because the gate electrode 21 of the metal oxide semiconductor transistor 11a may shield the light, the light shielding layer 14 in the metal oxide semiconductor transistor 11a can be optionally omitted. In some embodiments, the opening 33 may extend downward to penetrate through the ILD layer 23, the buffer layer 19b, the buffer layer 19a, and even the buffer layer 15.

An organic insulating layer 37 is disposed in the opening 33 and over the ILD layer 25, the metal oxide semiconductor layer 27, the source lines 29L1, the drain lines 29L2, the source electrode 29s, and the drain electrode 29d. A common electrode 39 is disposed over the organic insulating layer 37, which mainly corresponds to the pixel region 10a. An insulating layer 41 is disposed over the common electrode 39 and the organic insulating layer 37. A pixel electrode 43p is disposed over the insulating layer 41. A part of the pixel electrode 43p is disposed over the drain electrode 29d, and the pixel electrode 43p is connected to the drain electrode 29d by a via 43h penetrating through the insulating layer 41 and the organic insulating layer 37. In this embodiment, the organic insulating layer 37 may directly contact the ILD layer 23 through the opening 33. In FIG. 2, the polysilicon transistors 11n and 11p in the driving circuit 10b belong to a top gate structure, and the metal oxide semiconductor transistor 11a in the pixel region 10a belongs to a bottom gate structure. The silicon oxide layer (e.g. the ILD layer 25) between the metal oxide semiconductor layer 27 and the gate electrode 21 has an opening 33 corresponding to the aperture region 11o, as shown in FIG. 2. As such, the number of the interface between the silicon oxide layer and the silicon nitride layer in the aperture region 11o can be reduced, thereby improving the light transmittance of the array substrate structure 100b.

Figure 3:
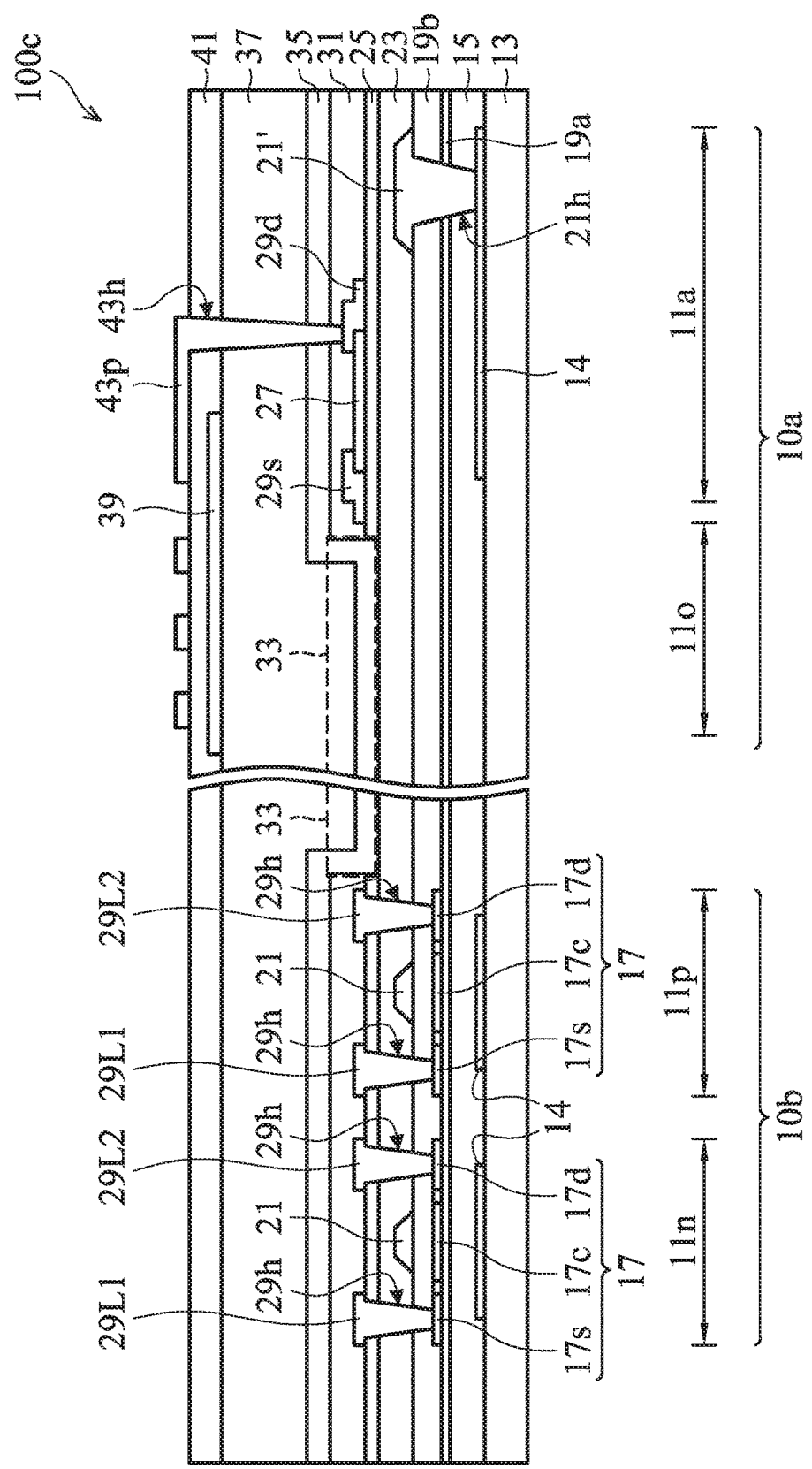

In one embodiment, a cross-sectional view of an array substrate structure 100c is shown in FIG. 3. In FIG. 3, the relative locations of the pixel region 10a, the driving circuit 10b, the metal oxide semiconductor transistor 11a, the aperture region 11o, and the polysilicon transistors 11n and 11p are similar to those in FIG. 1. Light shielding layers 14 are disposed over the substrate 13 to correspond to the polysilicon layers 17 of the polysilicon transistors 11n and 11p. The light shielding layer 14 is also disposed over the substrate 13 to correspond to the metal oxide semiconductor layer 27 of the metal oxide semiconductor transistor 11a. In this embodiment, the light shielding layer 14 corresponding to the metal oxide semiconductor transistor 11a also serves as the gate electrode of the metal oxide semiconductor transistor 11a, so the light shielding layers 14 must be comprise a conductive material such as metal, and is not limited thereto. In other words, the gate electrode and the light shielding layer 14 correspond to the same layer. The light shielding layers 14 can be formed by deposition and then patterned by lithography and etching.

A buffer layer 15 is disposed over the substrate 13 and the light shielding layers 14, and a buffer layer 19a is disposed over the buffer layer 15. The polysilicon layers 17 (such as the source regions 17s, the channel regions 17c, and the drain regions 17d) are disposed over the buffer layer 19a to correspond to the polysilicon transistors 11n and 11p. A buffer layer 19b is disposed over the polysilicon layers 17 and the buffer layer 19a. The gate electrodes 21 and a gate line 21' are disposed over the buffer layer 19b. For the polysilicon transistors 11n and 11p, the gate electrodes 21 are disposed over the channel regions 17c, and a gate insulation layer such as the buffer layer 19b is disposed therebetween. In the metal oxide semiconductor transistor 11a, the gate line 21' and the light shielding layer 14 are connected by a via 21h penetrating through the buffer layers 19b, 19a, and 15. The via 21h can be prepared by forming holes through the buffer layers 19b, 19a, and 15 by lithography and etching. Metal is filled into the hole and a metal layer is then formed on the buffer layer 19b. The metal layer is then patterned by lithography and etching to define the gate electrodes 21 and the gate line 21'.

An ILD layer 23 is disposed over the gate electrodes 21, the gate line 21', and the buffer layer 19b. An ILD layer 25 is disposed over the ILD layer 23. A metal oxide semiconductor layer 27 is disposed over the ILD layer 25 to correspond to the gate electrode (the light shielding layer 14) of the metal oxide semiconductor transistor 11a. For the metal oxide semiconductor transistor 11a, the gate insulating layer between the channel layer (metal oxide semiconductor layer 27) and the gate electrode (the light shielding layer 14) is the ILD layers 23 and 25 and the buffer layers 19b, 19a, and 15. Source lines 29L1, drain lines 29L2, a source electrode 29s, and a drain electrode 29d are formed on the ILD layer 25. The source lines 29L1 are disposed over the source regions 17s, and the source lines 29L1 are connected to the source regions 17s by vias 29h penetrating through the ILD layer 25, the ILD layer 23, and the buffer layer 19b. The drain lines 29L2 are disposed over the drain regions 17d, and the drain lines 29L2 are connected to the drain regions 17d by vias 29h penetrating through the ILD layer 25, the ILD layer 23, and the buffer layer 19b. The source electrode 29s and the drain electrode 29d are disposed over both sides of the metal oxide semiconductor layer 27.

An insulating layer 31 is disposed over the source lines 29L1, the drain lines 29L2, the source electrode 29s, the drain electrode 29d, the metal oxide semiconductor layer 27, and the ILD layer 25. The insulating layer 31 and the ILD layer 25 have an opening 33 corresponding to the aperture region 11o. The opening 33 can be formed by lithography and etching. Note that the exposure step in the lithography can be exposing from the bottom, in which the light shielding layers 14, the source lines 29L1, the drain lines 29L2, and the source electrode 29s serve as the photomask thereby omitting a photomask to reduce the cost. After the lithography by exposing from the bottom and etching, edges of the insulating layer 31 and the ILD layer 25 (silicon oxide layers) will be corresponded to an edge of the mask. In some embodiments, the opening 33 may extend downward to penetrate through the ILD layer 23, the buffer layer 19b, the buffer layer 19a, and even the buffer layer 15.

An insulating layer 35 is disposed over the insulating layer 31 and in the opening 33 to contact the ILD layer 23. An organic insulating layer 37 is disposed over the insulating layer 35. A common electrode 39 is disposed over the organic insulating layer 37, which mainly corresponds to the pixel region 10a. An insulating layer 41 is disposed over the common electrode 39 and the organic insulating layer 37. A pixel electrode 43p is disposed over the insulating layer 41. A part of the pixel electrode 43p is disposed over the drain electrode 29d, and the pixel electrode 43p is connected to the drain electrode 29d by a via 43h penetrating through the insulating layer 41, the organic insulating layer 37, the insulating layer 35, and the insulating layer 31. In FIG. 3, the polysilicon transistors 11n and 11p in the driving circuit 10b belong to a top gate structure, and the metal oxide semiconductor transistor 11a in the pixel region 10a, belongs to a bottom gate structure. The silicon oxide layer (e.g. the ILD layer 25) between the metal oxide semiconductor layer 27 and the gate electrode (e.g. the light shielding layer 14), and the silicon oxide layer (e.g. the insulating layer 31) over the metal oxide semiconductor layer 27 have an opening 33 corresponding to the aperture region 11o, as shown in FIG. 3. As such, the number of the interface between the silicon oxide layer and the silicon nitride layer in the aperture region 11o can be reduced, thereby improving the light transmittance of the array substrate structure 100c.

Figure 4:
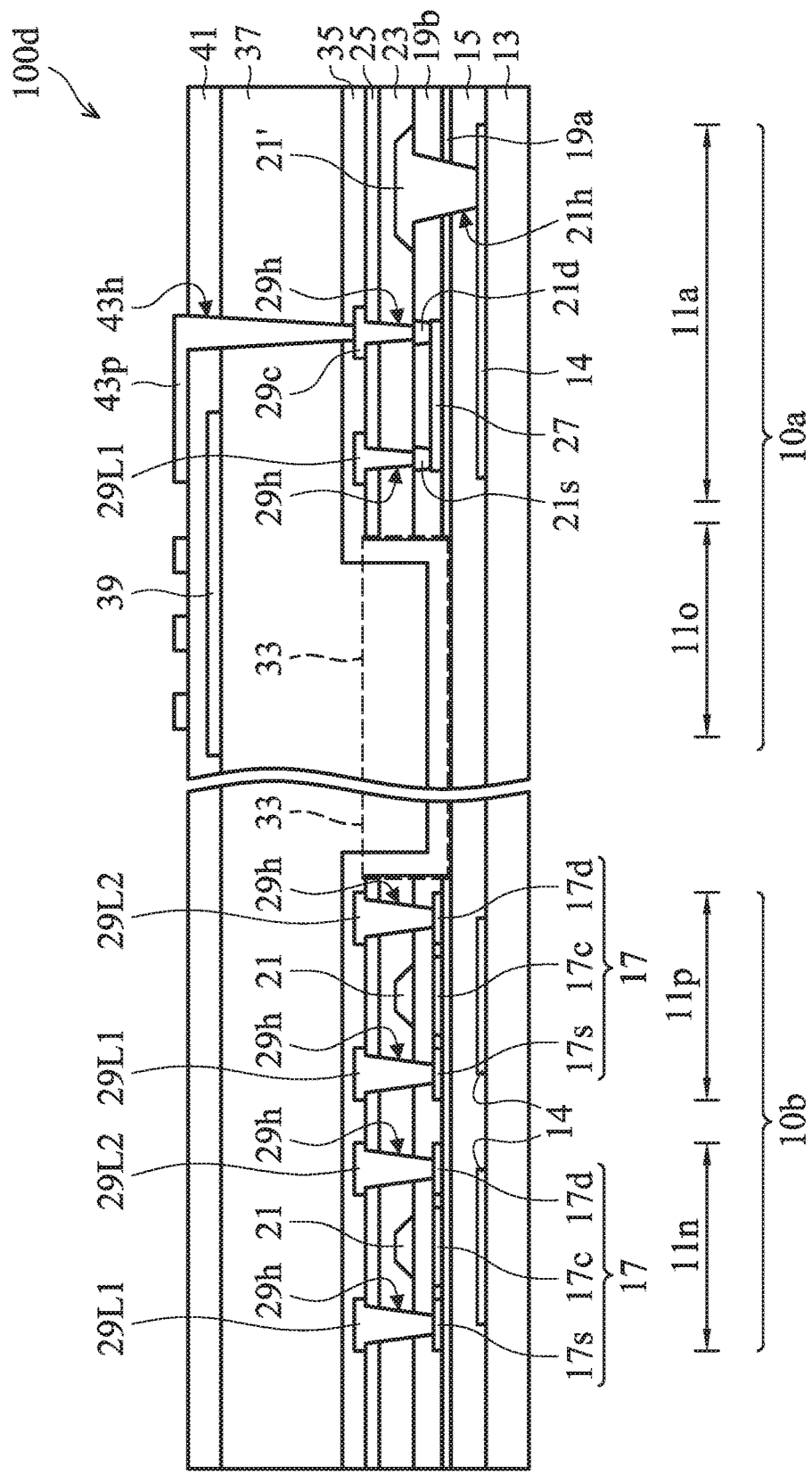

In one embodiment, a cross-sectional view of an array substrate structure 100d is shown in FIG. 4. In FIG. 4, the relative locations of the pixel region 10a, the driving circuit 10b, the metal oxide semiconductor transistor 11a, the aperture region 11o, and the polysilicon transistors 11n and 11p are similar to those in FIG. 1. Light shielding lagers 14 are disposed over the substrate 13 to correspond to the polysilicon layers 17 of the polysilicon transistors 11n and 11p. The light shielding layers 14 is also disposed over the substrate 13 to correspond to the metal oxide semiconductor layer 27 of the metal oxide semiconductor transistor 11a. In this embodiment, the light shielding layer 14 corresponding to the metal oxide semiconductor transistor 11a also serves as the gate electrode of the metal oxide semiconductor transistor 11a, so the light shielding layers 14 must comprise a conductive material such as metal, and is not limited thereto.

A buffer layer 15 is disposed over the substrate 13 and the light shielding layers 14, and a buffer layer 19a is disposed over the buffer layer 15. Polysilicon layers 17 (such as the source regions 17s, the channel regions 17c, and the drain regions 17d) are disposed over the buffer layer 19a to correspond to the polysilicon transistors 11n and 11p. A metal oxide semiconductor layer 27 is disposed over the buffer layer 19a to correspond to the gate electrode (e.g. the light shielding layer 14) of the metal oxide semiconductor transistor 11a A buffer layer 19b is disposed over the polysilicon layers 17, the metal oxide semiconductor layer 27, and the buffer layer 19a. Gate electrodes 21 and a gate line 21' are disposed over the buffer layer 19b. A source electrode 21s and a drain electrode 21d penetrate through the buffer layer 19b to contact both sides of the metal oxide semiconductor layer 27. For the polysilicon transistors 11n and 11p, the gate electrodes 21 are disposed over the channel regions 17c, and a gate insulation layer such as the buffer layer 19b is disposed therebetween. For the metal oxide semiconductor transistor 11a, the gate insulating layer between the channel region (the metal oxide semiconductor layer 27) and the gate electrode (the light shielding layer 14) consists of the buffer layers 19a and 15. In the metal oxide semiconductor transistor 11a, the gate line 21' and the light shielding layer 14 are connected by a via 21h penetrating through the buffer layers 19b, 19a, and 15.

An ILD layer 23 is disposed over the gate electrodes 21, the gate line 21', the source electrode 21s, the drain electrode 21d, and the buffer layer 19b. An ILD layer 25 is disposed over the ILD layer 23. Source lines 29L1, drain lines 29L2, and a contact 29c are disposed over the ILD layer 25. The source lines 29L1 of the polysilicon transistors 11n and 11p are disposed over the source regions 17s, and the source lines 29L1 are connected to the source regions 17s by vias 29h penetrating through the ILD layer 25, the ILD layer 23, and the buffer layer 19b. The drain lines 29L2 of the polysilicon transistors 11n and 11p are disposed over the drain regions 17d, and the drain lines 29L2 are connected to the drain regions 17d by vias 29h penetrating through the ILD layer 25, the ILD layer 23, and the buffer layer 19b. The source line 29L1 of the metal oxide semiconductor transistor 11a is disposed over the source electrode 21s, and the source line 29L1 is connected to the source electrode 21s by a via 29h penetrating through the ILD layer 25 and the ILD layer 23. The contact 29c of the metal oxide semiconductor transistor 11a is disposed over the drain electrode 21d, and the contact 29c is connected to the drain electrode 21d by a via 29h penetrating through the ILD layer 25 and the ILD layer 23. The ILD layer 25, the ILD layer 23, the buffer layer 19b, and the buffer layer 19a have an opening 33 corresponding to the aperture region 11o. The opening 33 can be formed by lithography and etching. Note that the exposure step in the lithography can be exposing from the bottom, in which the light shielding layers 14, the source lines 29L1, and the drain lines 29L2 serve as the photomask, thereby omitting a photomask to reduce the cost. After the lithography by exposing from the bottom and etching, edges of the ILD layer 25, the ILD layer 23, the buffer layer 19b, and the buffer layer 19a (silicon oxide layers) be corresponded to an edge of the mask. In some embodiments, the opening 33 may extend downward to penetrate through the buffer layer 15.

An insulating layer 35 is disposed over the ILD layer 25 and in the opening 33 to contact the buffer layer 15. An organic insulating layer 37 is disposed over the insulating layer 35. A common electrode 39 is disposed over the organic insulating layer 37, which mainly corresponds to the pixel region 10a. An insulating layer 41 is disposed over the common electrode 39 and the organic insulating layer 37. A pixel electrode 43p is disposed over the insulating layer 41. A part of the pixel electrode 43p is disposed over the contact 29c, and the pixel electrode 43p is connected to the contact 29c by a via 43h penetrating through the insulating layer 41, the organic insulating layer 37, and the insulating layer 35. In FIG. 4, the polysilicon transistors 11n and 11p in the driving circuit 10b belong to a top gate structure, and the metal oxide semiconductor transistor 11a in the pixel region 10a belongs to a bottom gate structure. The silicon oxide layers (e.g. the buffer layers 19a) between the metal oxide semiconductor layer 27 and the gate electrode (e.g. the light shielding layer 14), and the silicon oxide layer (e.g. the ILD layer 25) over the metal oxide semiconductor layer 27 have an opening 33 corresponding to the aperture region 11o, as shown in FIG. 4. As such, the number of the interface between the silicon oxide layer and the silicon nitride layer in the aperture region 11o can be reduced, thereby improving the light transmittance of the array substrate structure 100d.

Figure 5:
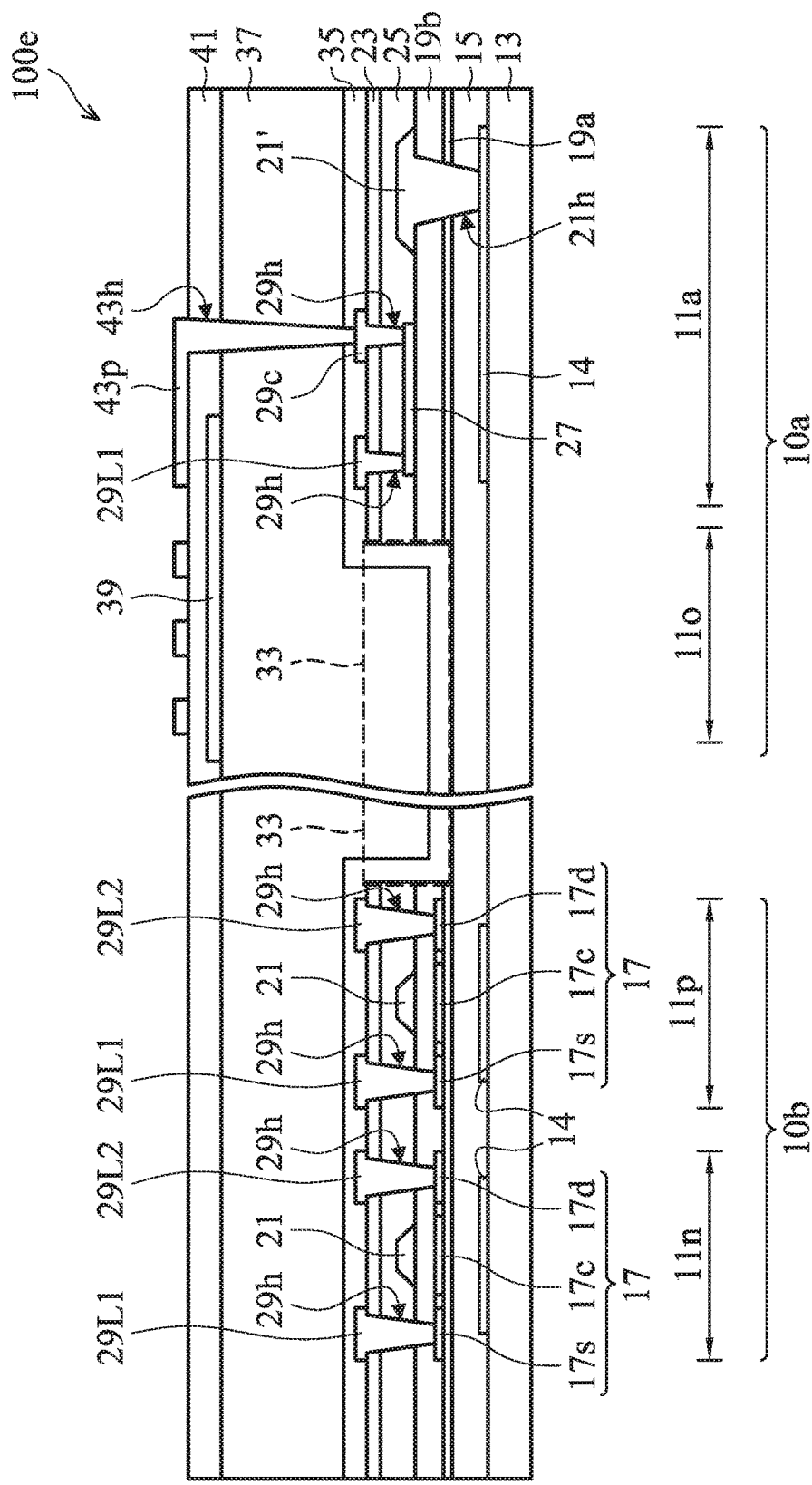

In one embodiment, a cross-sectional view of an array substrate structure 100e is shown in FIG. 5. In FIG. 5, the relative locations of the pixel region 10a, the driving circuit 10b, the metal oxide semiconductor transistor 11a, the aperture region 11o, and the polysilicon transistors 11n and 11p are similar to those in FIG. 1. Light shielding layers 14 are disposed over the substrate 13 to correspond to the polysilicon layers 17 of the polysilicon transistors 11n and 11p. The light shielding layers 14 is also disposed over the substrate 13 to correspond to the metal oxide semiconductor layer 27 of the metal oxide semiconductor transistor 11a. In this embodiment, the light shielding layer 14 corresponding to the metal oxide semiconductor transistor 11a also serves as the gate electrode of the metal oxide semiconductor transistor 11a, so the light shielding layers 14 must comprise a conductive material such as metal, and is not limited thereto.

A buffer layer 15 is disposed over the substrate 13 and the light shielding layers 14. A buffer layer 19a is disposed over the buffer layer 15. Polysilicon layers 17 (such as the source regions 17s, the channel regions 17c, and the drain regions 17d) are disposed over the buffer layer 19a to correspond to the polysilicon transistors 11n and 11p. A buffer layer 19b is disposed over the polysilicon layers 17 and the buffer layer 19a. Gate electrodes 21 and a gate line 21' are disposed over the buffer layer 19b. For the polysilicon transistors 11n and 11p, the gate electrodes 21 are disposed over the channel regions 17c, and a gate insulation layer such as the buffer layer 19b is disposed therebetween. In the metal oxide semiconductor transistor 11a, the gate line 21' and the light shielding layer 14 are connected by a via 21h penetrating through the buffer layers 19b, 19a, and 15. The metal oxide semiconductor layer 27 is disposed over the buffer layer 19b to correspond to the gate electrode (the light shielding layer 14) of the metal oxide semiconductor transistor 11a. For the metal oxide semiconductor transistor 11a, the gate insulating layer between the channel region (the metal oxide semiconductor layer 27) and the gate electrode (the light shielding layer 14) consists of buffer layers 19b, 19a and 15.

An ILD layer 25 is disposed over the buffer layer 19b, the gate electrodes 21, the gate line 21', and the metal oxide semiconductor layer 27. The ILD layer 25, the buffer layer 19b, and the buffer layer 19a have an opening 33 corresponding to the aperture region 11o. The opening 33 can be formed by lithography and etching. Note that the exposure step in the lithography can be exposed from the bottom, in which the light shielding layers 14, the source lines 29L1, the drain lines 29L2, and the gate line 21' serve as the photomask, thereby omitting a photomask to reduce the cost. After the lithography by exposing from the bottom and etching, edges of the ILD layer 25, the buffer layer 19b, and the buffer layer 19a (silicon oxide layers) will be corresponded to an edge of the mask. In some embodiments, the opening 33 may extend downward to penetrate through the buffer layer 15.

ILD layer 23 is disposed over the ILD layer 25, and the ILD layer 23 also has an opening 33 corresponding to the aperture region 11o. Source lines 29L1, drain lines 29L2, and a contact 29c are disposed over the ILD layer 23. The source lines 29L1 of the polysilicon transistors 11n and 11p are disposed over the source regions 17s, and the source lines 29L1 are connected to the source regions 17s by vias 29h penetrating through the ILD layer 23, the ILD layer 25, and the buffer layer 19b. The drain lines 29L2 of the polysilicon transistors 11n and 11p are disposed over the drain regions 17d, and the drain lines 29L2 are connected to the drain regions 17d by vias 29h penetrating through the ILD layer 23, the ILD layer 25, and the buffer layer 19b. The source line 29L1 of the metal oxide semiconductor transistor 11a is disposed over one side of the metal oxide semiconductor layer 27, and the source line 29L1 is connected to one side of the metal oxide semiconductor layer 27 by a via 29h penetrating through the ILD layer 23 and the ILD layer 25. The contact 29c of the metal oxide semiconductor transistor 11a is disposed over another side of the metal oxide semiconductor layer 27, and the contact 29c is connected to another side of the metal oxide semiconductor layer 27 by a via 29h penetrating through the ILD layer 23 and the ILD layer 25.

An insulating layer 35 is disposed over the source lines 29L1, the drain lines 29L2, the contact 29c, and the ILD layer 23, and in the opening 33 to contact the buffer layer 15. An organic insulating layer 37 is disposed over the insulating layer 35. A common electrode 39 is disposed over the organic insulating layer 37, which mainly corresponds to the pixel region 10a. An insulating layer 41 is disposed over the common electrode 39 and the organic insulating layer 37. A pixel electrode 43p is disposed over the insulating layer 41. A part of the pixel electrode 43p is disposed over the contact 29c, and the pixel electrode 43p is connected to the contact 29c by a via 43h penetrating through the insulating layer 41, the organic insulating layer 37, and the insulating layer 35. In FIG. 5, the polysilicon transistors 11n and 11p in the driving circuit 10b belong to a top gate structure, and the metal oxide semiconductor transistor 11a in the pixel region 10a belongs to a bottom gate structure. The silicon oxide layers (e.g. the buffer layers 19b and 19a) between the metal oxide semiconductor layer 27 and the gate electrode (e.g. the light shielding layer 14), and the silicon oxide layer (e.g. the ILD layer 25) on the metal oxide semiconductor layer 27 have an opening 33 corresponding to the aperture region 11o, as shown in FIG. 5. As such, the number of the interface between the silicon oxide layer and the silicon nitride layer in the aperture region 11o can be reduced, thereby improving the light transmittance of the array substrate structure 100e.

Figure 6:
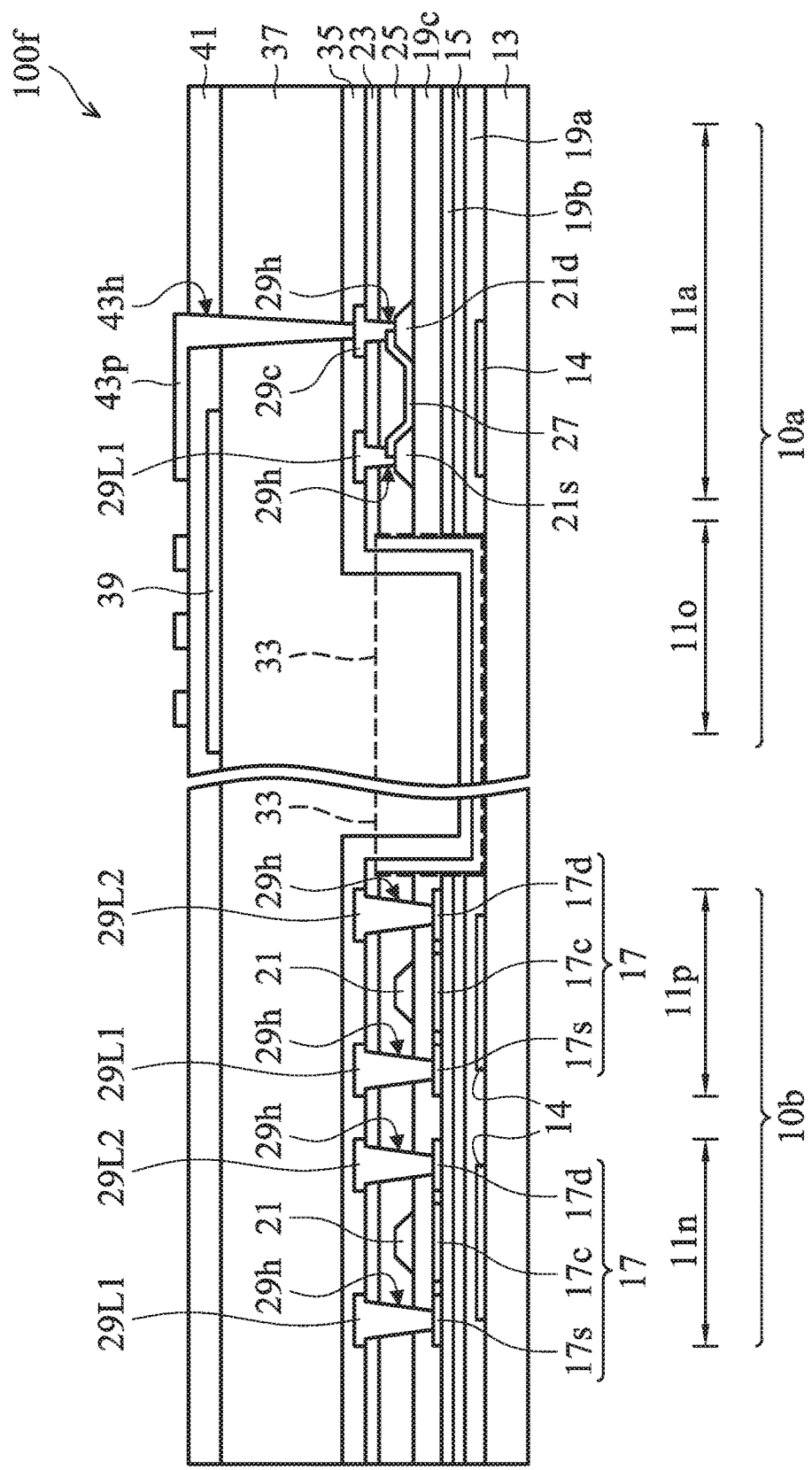

In one embodiment, a cross-sectional view of an array substrate structure 100f is shown in FIG. 6. In FIG. 6, the relative locations of the pixel region 10a, the driving circuit 10b, the metal oxide semiconductor transistor 11a, the aperture region 11o, and the polysilicon transistors 11n and 11p are similar to those in FIG. 1. Light shielding layers 14 are disposed over the substrate 13 to correspond to the polysilicon layers 17 of the polysilicon transistors 11n and 11p. The light shielding layer 14 is also disposed over the substrate 13 to correspond to the metal oxide semiconductor layer 27 of the metal oxide semiconductor transistor 11a. In this embodiment, the light shielding layer 14 corresponding to the metal oxide semiconductor transistor 11a also serves as the gate electrode of the metal oxide semiconductor transistor 11a, so the light shielding layers 14 must comprise of a conductive material such as metal, and is not limited thereto.

A buffer layer 19a is disposed over the substrate 13 and the light shielding layers 14. The buffer layer 15 is disposed over the buffer layer 19a, and the buffer layer 19b is disposed over the buffer layer 15. Polysilicon layers 17 (such as the source regions 17s, the channel regions 17c, and the drain regions 17d) are disposed over the buffer layer 19b to correspond to the polysilicon transistors 11n and 11p. A buffer layer 19c is disposed over the polysilicon layers 17 and the buffer layer 19b. The buffer layer 19c can be formed by CVD and can comprise silicon oxide, and is not limited thereto. Gate electrodes 21, a source electrode 21s, and a drain electrode 21d are disposed over the buffer layer 19c. The gate electrodes 21, the source electrode 21s, and the drain electrode 21d can comprise metal. The gate electrodes 21, the source electrode 21s, and the drain electrode 21d can be formed by deposition and then patterned by lithography and etching. For the polysilicon transistors 11n and 11p, the gate electrodes 21 are disposed over the channel regions 17c, and a gate insulation layer such as the buffer layer 19c is disposed therebetween. A metal oxide semiconductor layer 27 is disposed over the buffer layer 19c, and between the source electrode 21s and the drain electrode 21d to correspond to the gate electrode (the light shielding layer 14) of the metal oxide semiconductor transistor 11a. For the metal oxide semiconductor transistor 11a, the gate insulating layer between the channel region (the metal oxide semiconductor layer 27) and the gate electrode (the light shielding layer 14) comprises of buffer layers 19c, 19b, 15, and 19a.

An ILD layer 25 is disposed over the buffer layer 19c, the gate electrodes 21, the source electrode 21s, the drain electrode 21d, and the metal oxide semiconductor layer 27. The ILD layer 25, the buffer layer 19c, the buffer layer 19b, the buffer layer 15, and the buffer layer 19a have an opening 33 corresponding to the aperture region 11o. The opening 33 can be formed by lithography and etching. Note that the exposure step in the lithography can be performed by exposing from the bottom, in which the light shielding layers 14, the source lines 29L1, the drain lines 29L2, the source electrode 21s, and the drain electrode 21d serve as the photomask, thereby omitting a photomask to reduce the cost. After the lithography by exposing from the bottom and etching, edges of the ILD layer 25, the buffer layer 19c, the buffer layer 19b, and the buffer layer 19a (silicon oxide layers) will be corresponded to an edge of the mask.

An ILD layer 23 is disposed over the ILD layer 25, and in the opening 33 to contact the substrate 13. Source lines 29L1, drain lines 29L2, and a contact 29c are disposed over the ILD layer 23. The source lines 29L1 of the polysilicon transistors 11n and 11p are disposed over the source regions 17s, and the source lines 29L1 are connected to the source regions 17s by vias 29h penetrating through the ILD layer 23, the ILD layer 25, and the buffer layer 19c. The drain lines 29L2 of the polysilicon transistors 11n and 11p are disposed over the drain regions 17d, and the drain lines 29L2 are connected to the drain regions 17d by vias 29h penetrating through the ILD layer 23, the ILD layer 25, and the buffer layer 19c. The source line 29L1 of the metal oxide semiconductor transistor 11a is disposed over the source electrode 21s, and the source line 29L1 is connected to the source electrode 21s by a via 29h penetrating through the ILD layer 23 and the ILD layer 25. The contact 29c of the metal oxide semiconductor transistor 11a is disposed over the drain electrode 21d, and the contact 29c is connected to the drain electrode 21d by a via 29h penetrating through the ILD layer 23 and the ILD layer 25.

An insulating layer 35 is disposed over the source lines 29L1, the drain lines 29L2, the contact 29c, and the ILD layer 23. An organic insulating layer 37 is disposed over the insulating layer 35. A common electrode 39 is disposed over the organic insulating layer 37, which mainly corresponds to the pixel region 10a. An insulating layer 41 is disposed over the common electrode 39 and the organic insulating layer 37. A pixel electrode 43p is disposed over the insulating layer 41. A part of the pixel electrode 43p is disposed over the contact 29c, and the pixel electrode 43p is connected to the contact 29c by a via 43h penetrating through the insulating layer 41, the organic insulating layer 37, and the insulating layer 35. In FIG. 6, the polysilicon transistors 11n and 11p in the driving circuit 10b belong to a top gate structure, and the metal oxide semiconductor transistor 11a in the pixel region 10a belongs to a bottom gate structure. The silicon oxide layers (e.g. the buffer layers 19c, 19b, and 19a) between the metal oxide semiconductor layer 27 and the gate electrode (e.g. the light shielding layer 14), and the silicon oxide layer (e.g. the ILD layer 25) on the metal oxide semiconductor layer 27 have an opening 33 corresponding to the aperture region 11o, as shown in FIG. 6. As such, the number of the interface between the silicon oxide layer and the silicon nitride layer in the aperture region 11o can be reduced, thereby improving the light transmittance of the array substrate structure 100f.

Figure 7:
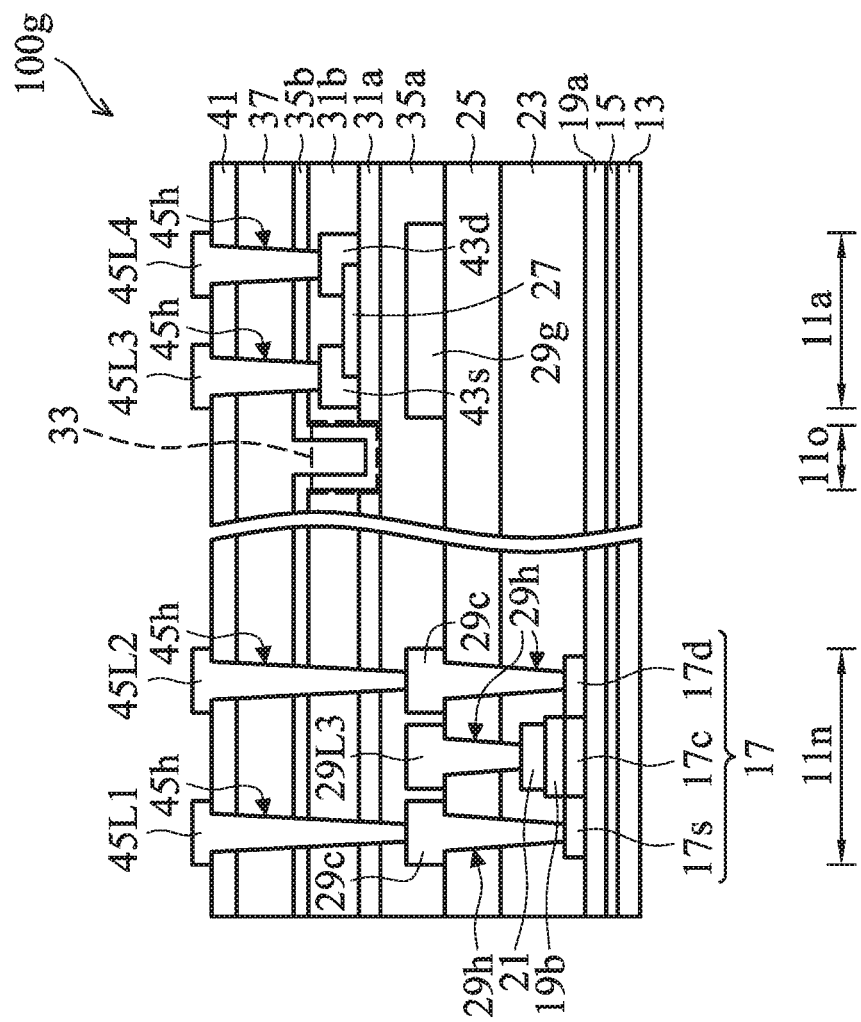

In one embodiment, a cross-sectional view of an array substrate structure 100g is shown in FIG. 7. In FIG. 7, the relative locations of the metal oxide semiconductor transistor 11a, the aperture region 11o, and the n-type polysilicon transistor 11n are similar to those in FIG. 1. This embodiment may further include a p-type polysilicon transistor 11p, or replace the n-type polysilicon transistor 11n with the p-type polysilicon transistor 11*p* if necessary. A buffer layer 15 is disposed over a substrate 13, and a buffer layer 19*a* is disposed over the buffer layer 15. A polysilicon layer 17 (such as the source region 17*s*, the channel region 17*c*, and the drain region 17*d*) is disposed over the buffer layer 19*a* to correspond to the polysilicon transistor 11*n*. A buffer layer 19*b* is disposed over a part of the polysilicon layer 17, and a gate electrode 21 is disposed over the buffer layer 19*b*. For the polysilicon transistor 11*n*, the gate electrode 21 is disposed over the channel region 17*c*, and the buffer layer 19*b* (serving as a gate insulating layer) is disposed therebetween. The ILD layer 23 is disposed over the gate electrode 21, the source region 17*s*, the drain region 17*d*, and the buffer layer 19*a*. The ILD layer 25 is disposed over the ILD layer 23.

Contacts 29*c*, a gate line 29L3, and a gate electrode 29*g* are disposed over the ILD layer 25. The contact 29*c* of the polysilicon transistor 11*n* is disposed over the source region 17*s* (or the drain region 17*d*), and the contact 29*c* is connected to the source region 17*s* (or the drain region 17*d*) by a via 29*h* penetrating through the ILD layers 25 and 23. The gate line 29L3 of the polysilicon transistor 11*n* is disposed over the gate electrode 21, and the gate line 29L3 is connected to the gate electrode 21 by a via 29*h* penetrating through the ILD layers 25 and 23.

An insulating layer 35*a* is disposed over the contacts 29*c*, the gate line 29L3, and the gate electrode 29*g*. The insulating layer 35*a* can be formed by CVD and can comprise silicon nitride, and is not limited thereto. An insulating layer 31*a* is disposed over the insulating layer 35*a*. The insulating layer 31*a* can be formed by CVD and can comprise silicon oxide, and is not limited thereto. A metal oxide semiconductor layer 27 is disposed over the insulating layer 31*a* to correspond to the gate electrode 29*g* of the metal oxide semiconductor transistor 11*a*. For the metal oxide semiconductor transistors 11*a*, the gate insulation layer disposed between the channel region (the metal oxide semiconductor layer 27) and the gate electrode 29*g* is the insulating layers 31*a* and 35*a*. A source electrode 43*s* and a drain electrode 43*d* are disposed over both respective sides of the metal oxide semiconductor layer 27. The source electrode 43*s* and the drain electrode 43*d* can comprise metal, and can be formed by sputtering and then patterned by lithography and etching. An insulating layer 31*b* is disposed over the source electrode 43*s*, the drain electrode 43*d*, the metal oxide semiconductor layer 27, and the insulating layer 31*a*. The insulating layer 31*b* can be formed by CVD and can comprise silicon oxide, and is not limited thereto. The insulating layers 31*a* and 31*b* have an opening 33 corresponding to the aperture region 11*o*. The opening 33 can be formed by lithography and etching. In some embodiments, the opening 33 may extend downward to penetrate through the insulating layer 35*a*, the ILD layer 25, the ILD layer 23, the buffer layer 19*a*, and even the buffer layer 15.

An insulating layer 35*b* is disposed over the insulating layer 31*b*, and in the opening 33 to contact the insulating layer 35*a*. The insulating layer 35*b* can be formed by CVD and can comprise silicon nitride, and is not limited thereto. An organic insulating layer 37 is disposed over the insulating layer 35*b*, and an insulating layer 41 is disposed over the organic insulating layer 37. Source lines 45L1 and 45L3, and drain lines 45L2 and 45L4 are disposed over the insulating layer 41. The source lines 45L1 and 45L3 can be metal, alloy, or another conductive material. The drain lines 45L2 and 45L4 can be metal, alloy, or another conductive material. The source line 45L1 of the polysilicon transistor 11*n* is disposed over a left contact 29*c*. The source line 45L1 is connected to the left contact 29*c* by a via 45*h* penetrating through the insulating layer 41, the organic insulating layer 37, the insulating layer 35*b*, the insulating layer 31*b*, the insulating layer 31*a*, and the insulating layer 35*a*. The drain line 45L2 of the polysilicon transistor 11*n* is disposed over a right contact 29*c*. The drain line 45L2 is connected to the right contact 29*c* by a via 45*h* penetrating through the insulating layer 41, the organic insulating layer 37, the insulating layer 35*b*, the insulating layer 31*b*, the insulating layer 31*a*, and the insulating layer 35*a*. The source line 45L3 of the metal oxide semiconductor transistor 11*a* is disposed over the source electrode 43*s*. The source line 45L3 is connected to the source electrode 43*s* by a via 45*h* penetrating through the insulating layer 41, the organic insulating layer 37, the insulating layer 35*b*, and the insulating layer 31*b*. The drain line 45L4 of the metal oxide semiconductor transistor 11*a* is disposed over the drain electrode 43*d*. The drain line 45L4 is connected to the drain electrode 43*d* by a via 45*h* penetrating through the insulating layer 41, the organic insulating layer 37, the insulating layer 35*b*, and the insulating layer 31*b*.

In FIG. 7, the polysilicon transistor 11*n* belongs to a top gate structure, and the metal oxide semiconductor transistor 11*a* belongs to a bottom gate structure. The silicon oxide layer (e.g. the insulating layer 31*a*) between the metal oxide semiconductor layer 27 and the gate electrode 29*g*, and the silicon oxide layer (e.g. the insulating layer 31*b*) on the metal oxide semiconductor layer 27 have an opening 33 corresponding to the aperture region 11*o*, as shown in FIG. 7. As such, the number of the interface between the silicon oxide layer and the silicon nitride layer in the aperture region 11*o* can be reduced, thereby improving the light transmittance of the array substrate structure 100*g*.

Figure 8:
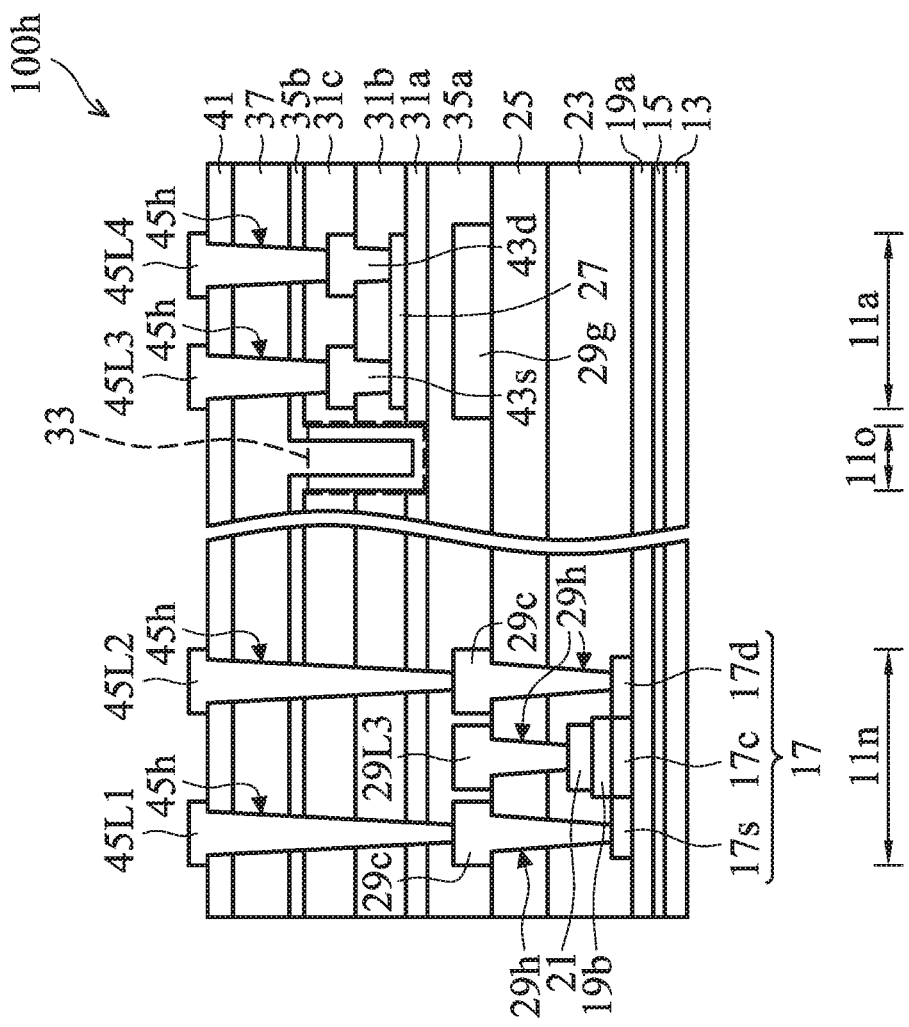

In one embodiment, a cross-sectional view of an array substrate structure 100*h* is shown in FIG. 8. In FIG. 8, the relative locations of the metal oxide semiconductor transistor 11*a*, the aperture region 11*o*, and the n-type polysilicon transistor 11*n* are similar to those in FIG. 1. This embodiment may further include a p-type polysilicon transistor 11*p*, or replace the n-type polysilicon transistor 11*n* with the p-type polysilicon transistor 11*p* if necessary. A buffer layer 15 is disposed over a substrate 13, and a buffer layer 19*a* is disposed over the buffer layer 15. A polysilicon layer 17 (such as the source region 17*s*, the channel region 17*c*, and the drain region 17*d*) is disposed over the buffer layer 19*a* to correspond to the polysilicon transistor 11*n*. A buffer layer 19*b* is disposed over a part of the polysilicon layer 17, and a gate electrode 21 is disposed over the buffer layer 19*b*. For the polysilicon transistor 11*n*, the gate electrode 21 is disposed over the channel region 17*c*, and the buffer layer 19*b* (serving as a gate insulating layer) is disposed therebetween. The ILD layer 23 is disposed over the gate electrode 21, the source region 17*s*, the drain region 17*d*, and the buffer layer 19*a*. The ILD layer 25 is disposed over the ILD layer 23.

Contacts 29*c*, a gate line 29L3, and a gate electrode 29*g* are disposed over the ILD layer 25. The contact 29*c* of the polysilicon transistor 11*n* is disposed over the source region 17*s* (or the drain region 17*d*). The contact 29*c* is connected to the source region 17*s* (or the drain region 17*d*) by a via 29*h* penetrating through the ILD layers 25 and 23. The gate line 29L3 of the polysilicon transistor 11*n* is disposed over the gate electrode 21. The gate line 29L3 is connected to the gate electrode 21 by a via 29*h* penetrating through the ILD layers 25 and 23.

An insulating layer 35*a* is disposed over the contacts 29*c*, the gate line 29L3, and the gate electrode 29*g*. An insulating layer 31a is disposed over the insulating layer 35a. A metal oxide semiconductor layer 27 is disposed over the insulating layer 31a to correspond to the gate electrode 29g of the metal oxide semiconductor transistor 11a. For the metal oxide semiconductor transistors 11a the gate insulation layer disposed between the channel region (the metal oxide semiconductor layer 27) and the gate electrode 29g is the insulating layers 31a and 35a. An insulating layer 31b is disposed over the metal oxide semiconductor layer 27 and the insulating layer 31a.

The source electrode 43s and the drain electrode 43d are disposed over both sides of the metal oxide semiconductor layer 27. The source electrode 43s and the drain electrode 43d are connected to the metal oxide semiconductor layer 27 by vias penetrating through the insulating layer 31b. The source electrode 43s and the drain electrode 43d can comprise metal. The source electrode 43s and the drain electrode 43d can be prepared by forming openings in the insulating layer 31b by lithography and etching, filling the metal into the opening and forming a metal layer on the insulating layer 31b, and then patterning the metal layer by lithography and etching to define the source electrode 43s and the drain electrode 43d. An insulating layer 31c is disposed over the source electrode 43s, the drain electrode 43d, the metal oxide semiconductor layer 27, and the insulating layer 31b. The insulating layer 31c can be formed by CVD and can comprise silicon oxide, and is not limited thereto. The insulating layers 31a, 31b, and 31c have an opening 33 corresponding to the aperture region 11o. The opening 33 can be formed by lithography and etching. In some embodiments, the opening 33 may extend downward to penetrate through the insulating layer 35a, the ILD layer 25, the ILD layer 23, the buffer aver 19a, and even the buffer layer 15.

An insulating layer 35b is disposed over the insulating layer 31c, and in the opening 33 to contact the insulating layer 35a. An organic insulating layer 37 is disposed over the insulating layer 35b, and an insulating layer 41 is disposed over the organic insulating layer 37. Source lines 45L1 and 45L3, and drain lines 45L2 and 45L4 are disposed over the insulating layer 41. The source lines 45L1 and 45L3 can be metal, alloy, or another conductive material. The drain lines 45L2 and 45L4 can be metal, alloy, or another conductive material. The source line 45L1 of the polysilicon transistor 11n is disposed over a left contact 29c. The source line 45L1 is connected to the left contact 29c by a via 45h penetrating through the insulating layer 41, the organic insulating layer 37, the insulating laser 35b, the insulating laser 31c, the insulating layer 31b, the insulating layer 31a, and the insulating layer 35a. The drain line 45L2 of the polysilicon transistor 11n is disposed over a right contact 29c. The drain line 45L2 is connected to the right contact 29c by a via 45h penetrating through the insulating layer 41, the organic insulating layer 37, the insulating layer 35b, the insulating layer 31c, the insulating layer 31b, the insulating layer 31a, and the insulating layer 35a. The source line 45L3 of the metal oxide semiconductor transistor 11a is disposed over the source electrode 43s. The source line 45L3 is connected to the source electrode 43s by a via 45h penetrating through the insulating layer 41, the organic insulating layer 37, the insulating layer 35b, and the insulating layer 31c. The drain line 45L4 of the metal oxide semiconductor transistor 11a is disposed over the drain electrode 43d. The drain line 45L4 is connected to the drain electrode 43d by a via 45h penetrating through the insulating layer 41, the organic insulating layer 37, the insulating layer 35b, and the insulating layer 31c.

In FIG. 8, the polysilicon transistor 11n belongs to a top gate structure, and the metal oxide semiconductor transistor 11a belongs to a bottom gate structure. The silicon oxide layer (e.g. the insulating layer 31a) between the metal oxide semiconductor layer 27 and the gate electrode 29g, and the silicon oxide layers (e.g. the insulating layers 31b and 31c) on the metal oxide semiconductor layer 27 have an opening 33 corresponding to the aperture region 11o, as shown in FIG. 8. As such, the number of the interface between the silicon oxide layer and the silicon nitride layer in the aperture region 11o can be reduced, thereby improving the light transmittance of the array substrate structure 100h.

Figure 9A:
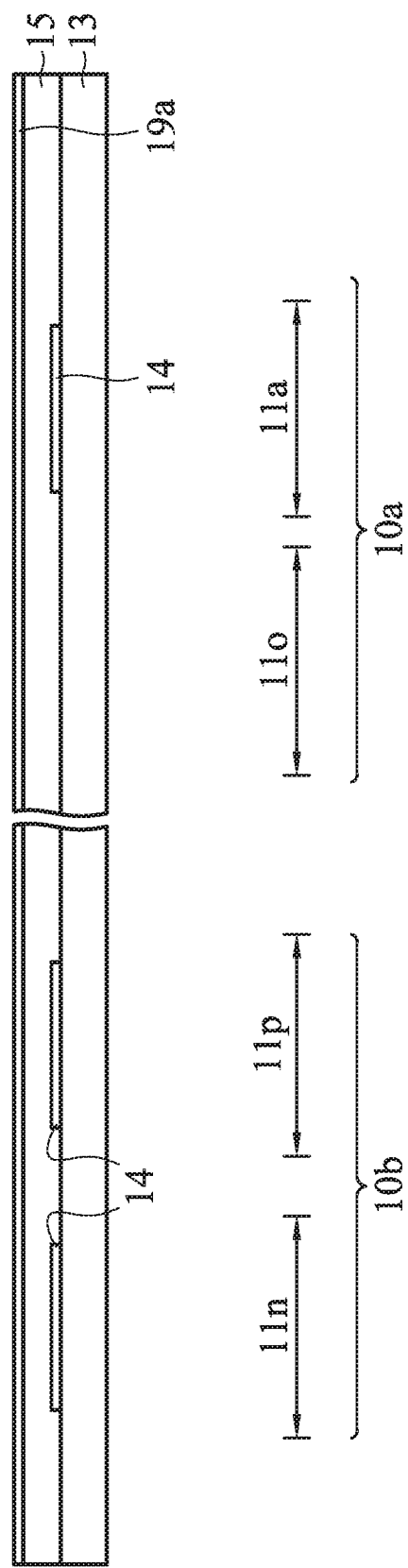
FIGS. 9A to 9J, 10A to 10C, and 11A to 11B are cross-sectional views of array substrate structures during manufacturing processes in one embodiment of the disclosure.
Figure 9B:
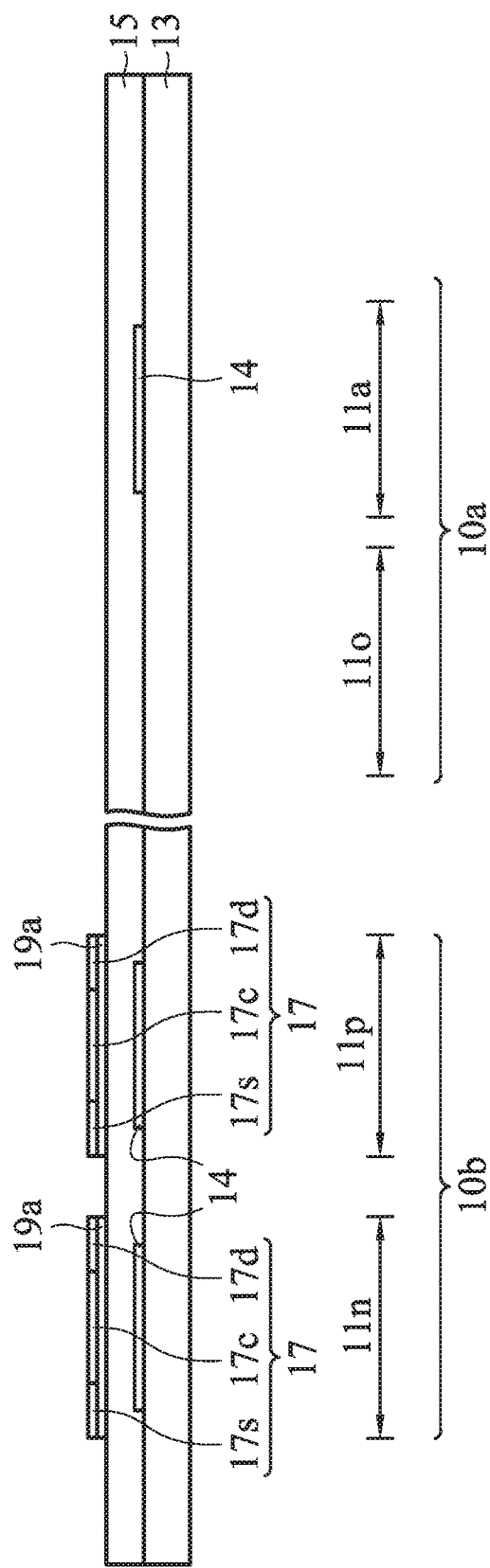
Figure 9C:
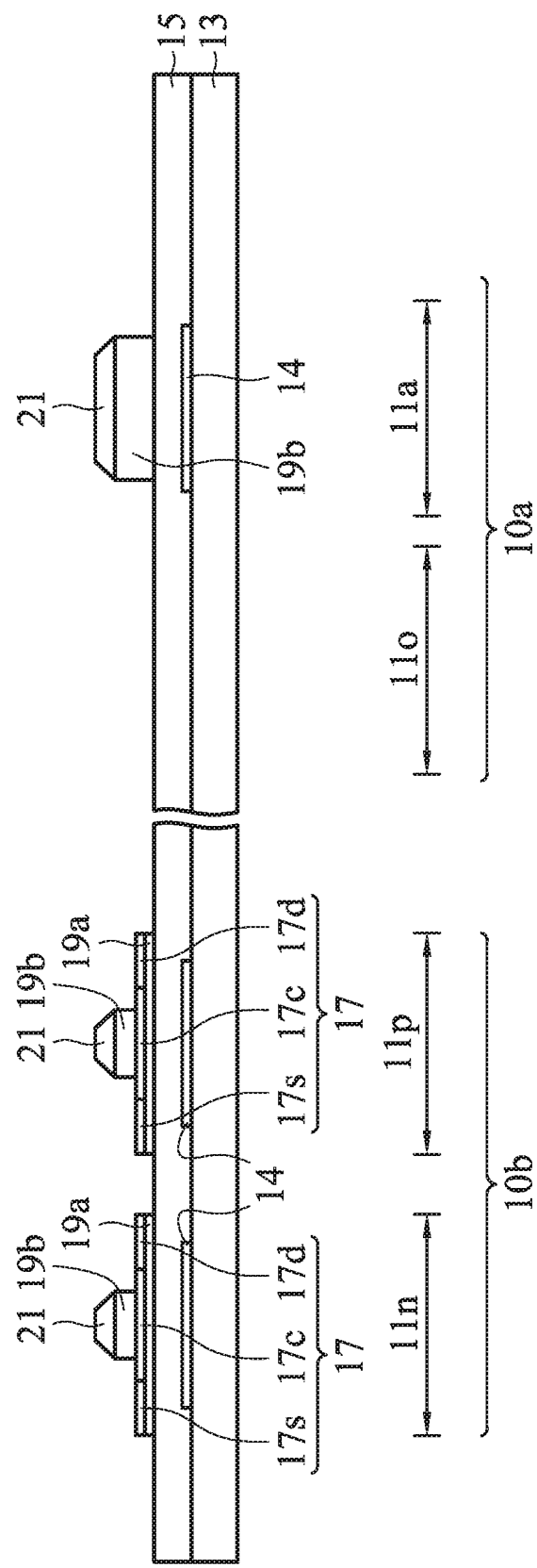

In one embodiment, cross-sectional views of processes for manufacturing an array substrate structure 100i are shown in FIGS. 9A to 9J. In FIG. 9A, the array substrate structure 100i is divided to a plurality of pixel regions 10a and a driving circuit 10b. Each of the pixel regions 10a includes a metal oxide semiconductor transistor 11a and an aperture region 11o, and the driving circuit 10b includes an n-type polysilicon transistor 11n and a p-type polysilicon transistor 11p. In another embodiment, the driving circuit 10b may include only the n-type polysilicon transistor 11n or only the p-type polysilicon transistor 11p if necessary. Light shielding layers 14 are formed over the substrate 13 to correspond to polysilicon layers 17 of the n-type polysilicon transistor 11n and the p-type polysilicon transistor 11p. The light shielding layer 14 is formed over the substrate 13 to correspond to a metal oxide semiconductor layer 27 of the metal oxide semiconductor transistor 11a. A buffer layer 15 is formed over the light shielding layers 14, and a buffer layer 19a is formed over the buffer layer 15. As shown in FIG. 9B, polysilicon layers 17 are disposed over the buffer layer 19a to correspond to the polysilicon transistors 11n and 11p. The buffer layer 19a not covered by the polysilicon layers 17 can then be removed. Alternatively, the buffer layer 19a can be kept on the entire buffer layer 15. In one embodiment, a light-shielding photoresist pattern defined by lithography is used to protect the middle part of the polysilicon layers 17 (e.g. a channel regions 17c) after forming the polysilicon layers 17. Other parts at both sides of the channel regions 17c are implanted to define source regions 17s and drain regions 17d. The photoresist pattern can then be optionally removed by wet or dry stripping. As shown in FIG. 9C, a buffer layer 19b is formed over the polysilicon layers 17 and the buffer layer 15, and a metal layer is formed over the buffer layer 19b. The metal layer is then patterned by lithography and etching to define gate electrodes 21 corresponding to the channel regions 17c of the polysilicon transistors 11n and 11p, and the light shielding layer 14 of the metal oxide semiconductor transistor 11a. The buffer layer 19b not covered by the gate electrodes 21 is then removed. For the polysilicon transistors 11n and 11p, the gate electrodes correspond to the channel region 17c, and a gate insulating layer (e.g. the buffer layer 19b) is disposed therebetween.

Figure 9D:
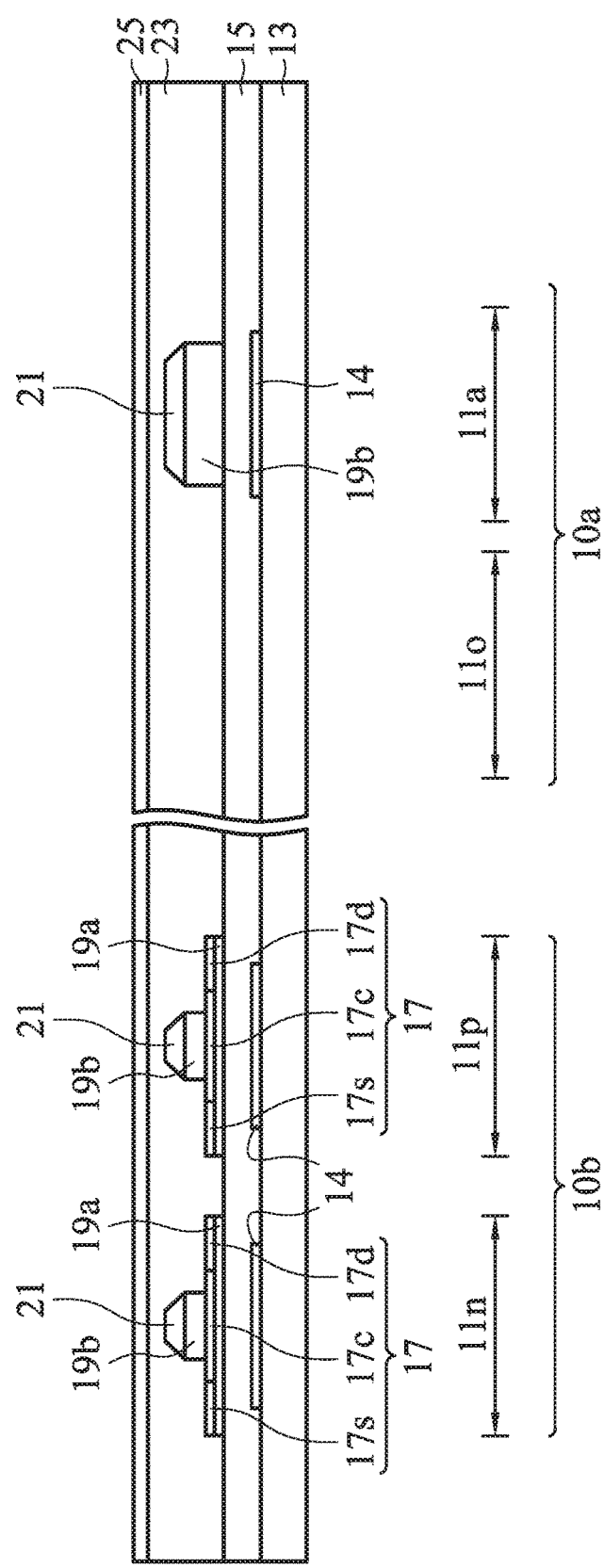
Figure 9E:
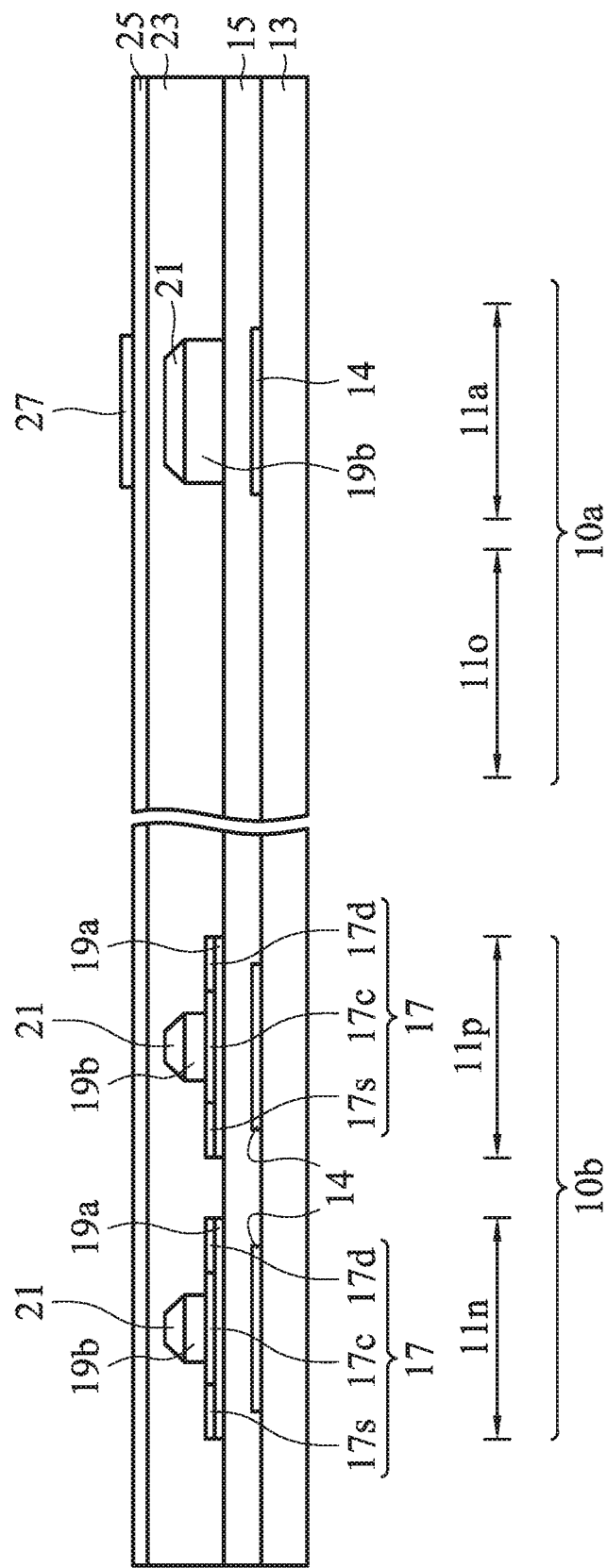

As shown in FIG. 9D, an ILD layer 23 is formed over the gate electrodes 21, the buffer layer 15, the source region 17s, and the drain region 17d. An ILD layer 25 is then formed over the ILD layer 23. As shown in FIG. 9E, a metal oxide semiconductor layer 27 is formed over the ILD layer 25 to correspond to the gate electrode 21 of the metal oxide semiconductor transistor 11a. For the metal oxide semiconductor transistor 11a, the gate insulating layer between the channel layer (metal oxide semiconductor layer 27) and the gate electrode 21 is the ILD layers 23 and 25.

Figure 9F:
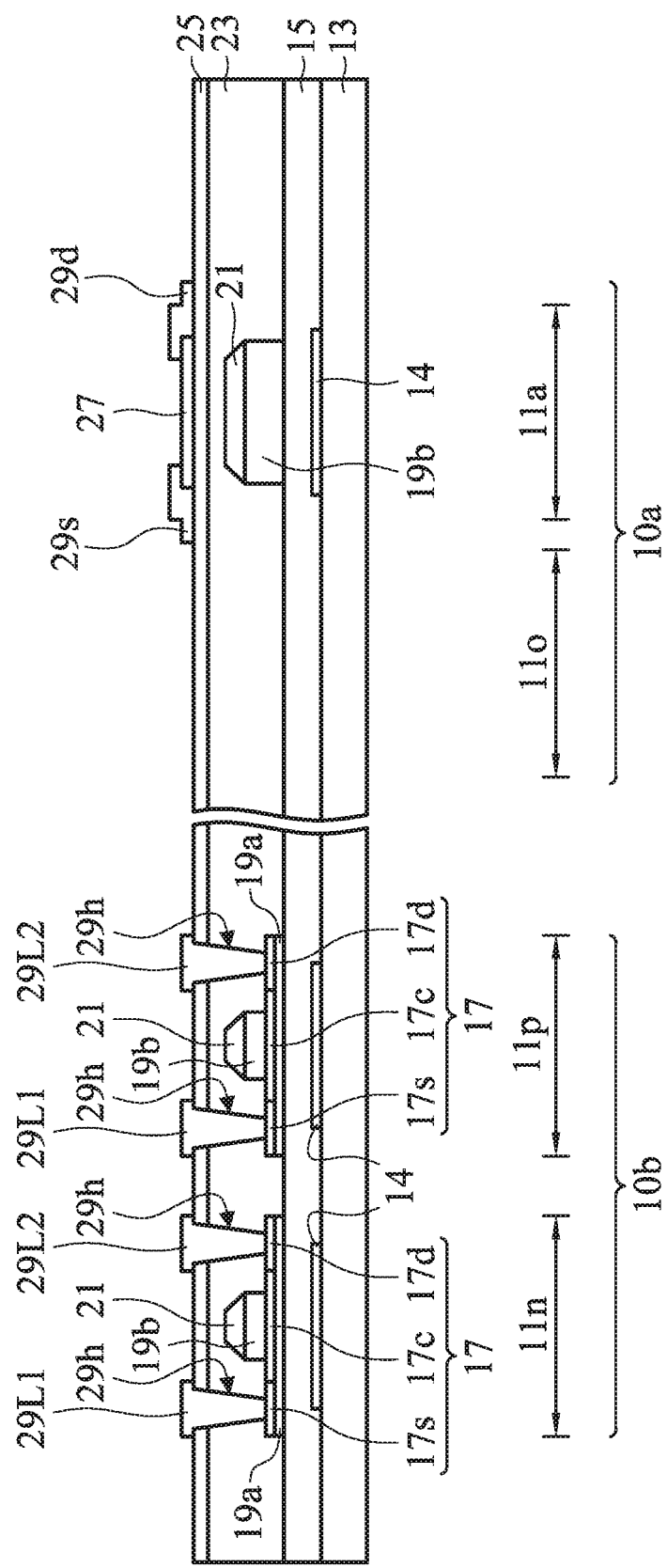

As shown in FIG. 9F, the ILD layers 23 and 25 are patterned by lithography and etching to form vias 29 therein, and metal is filled into the vias 29. A layer of the metal is formed over the ILD layer 25, and then patterned to define source lines 29L1, drain lines 29L2, a source electrode 29s, and a drain electrode 29d on the ILD layer 25. The source lines 29L1 are disposed over the source regions 17s. The source lines 29L1 are connected to the source regions 17s by vias 29h penetrating through the ILD layer 25 and the ILD layer 23. The drain lines 29L2 are disposed over the drain regions 17d. The drain lines 29L2 are connected to the drain regions 17d by vias 29h penetrating through the ILD layer 25 and the ILD layer 23. The source electrode 29s and the drain electrode 29d are disposed over both sides of the metal oxide semiconductor layer 27.

Figure 9G:
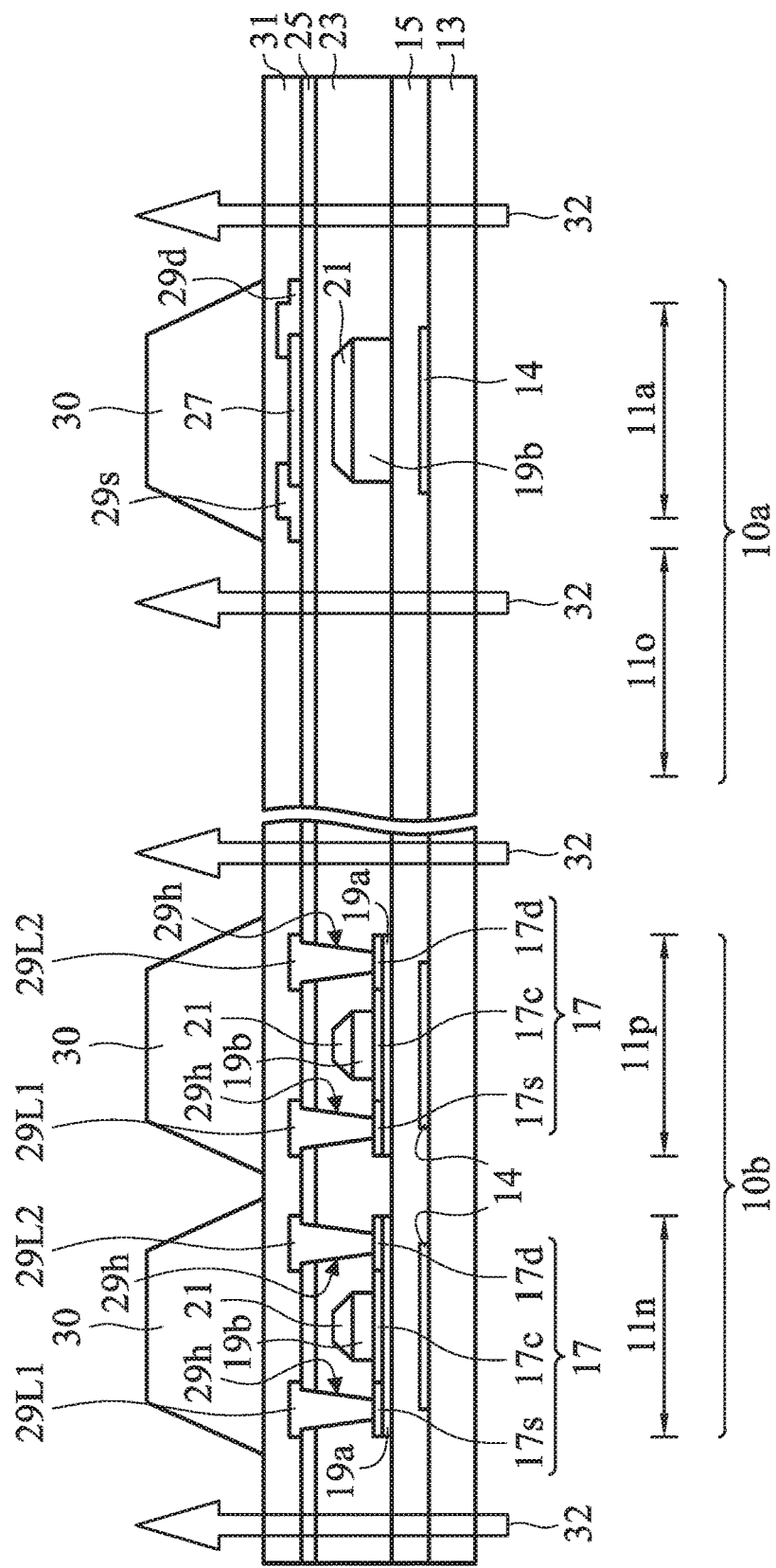

As shown in FIG. 9G, an insulating layer 31 is formed over the ILD layer 25, the metal oxide semiconductor layer 27, the source lines 29L1, the drain lines 29L2, the source electrode 29s, and the drain electrode 29d. A photoresist layer is then formed over the insulating layer 31, and an exposure step 32 is performed by exposing from the bottom, and the photoresist layer is then developed to form the photoresist pattern 30. The exposure step 32 by exposing from the bottom no longer needs a photomask, because the light shielding layers 14, the source lines 29L1, the drain lines 29L2, the source electrode 29s, and the drain electrode 29d serve as the photomask.

Figure 9H:
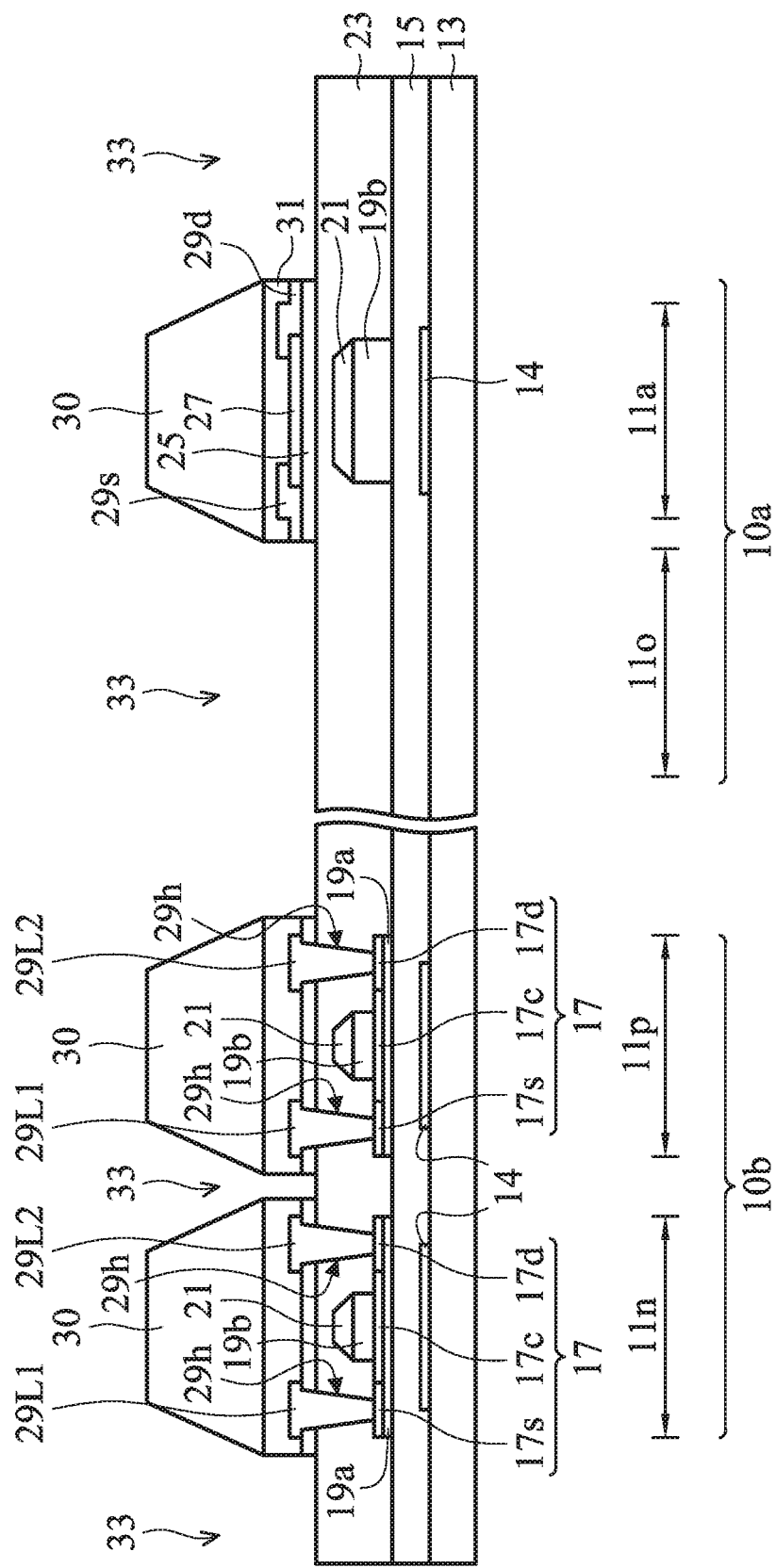

As shown in FIG. 9H, the photoresist pattern is used as an etching mask, and the insulating layer 31 and the ILD layer 25 not covered by the photoresist pattern 30 are etched and removed to form an opening 33. As shown in FIG. 9H, the opening 33 mainly corresponds to the aperture region 11o, but it may also correspond to the other parts not masked by the photoresist pattern 30. As shown in FIG. 9H, the remained insulating layer 31 and the ILD layer 25 have edges corresponding to an edge of the mask (e.g. the light shielding layers 14, the source lines 29L1, the drain lines 29L2, the source electrode 29s, and the drain electrode 29d). In some embodiments, the opening 33 may further extend downward to penetrate the ILD layer 23 and even the buffer layer 15.

Figure 9I:
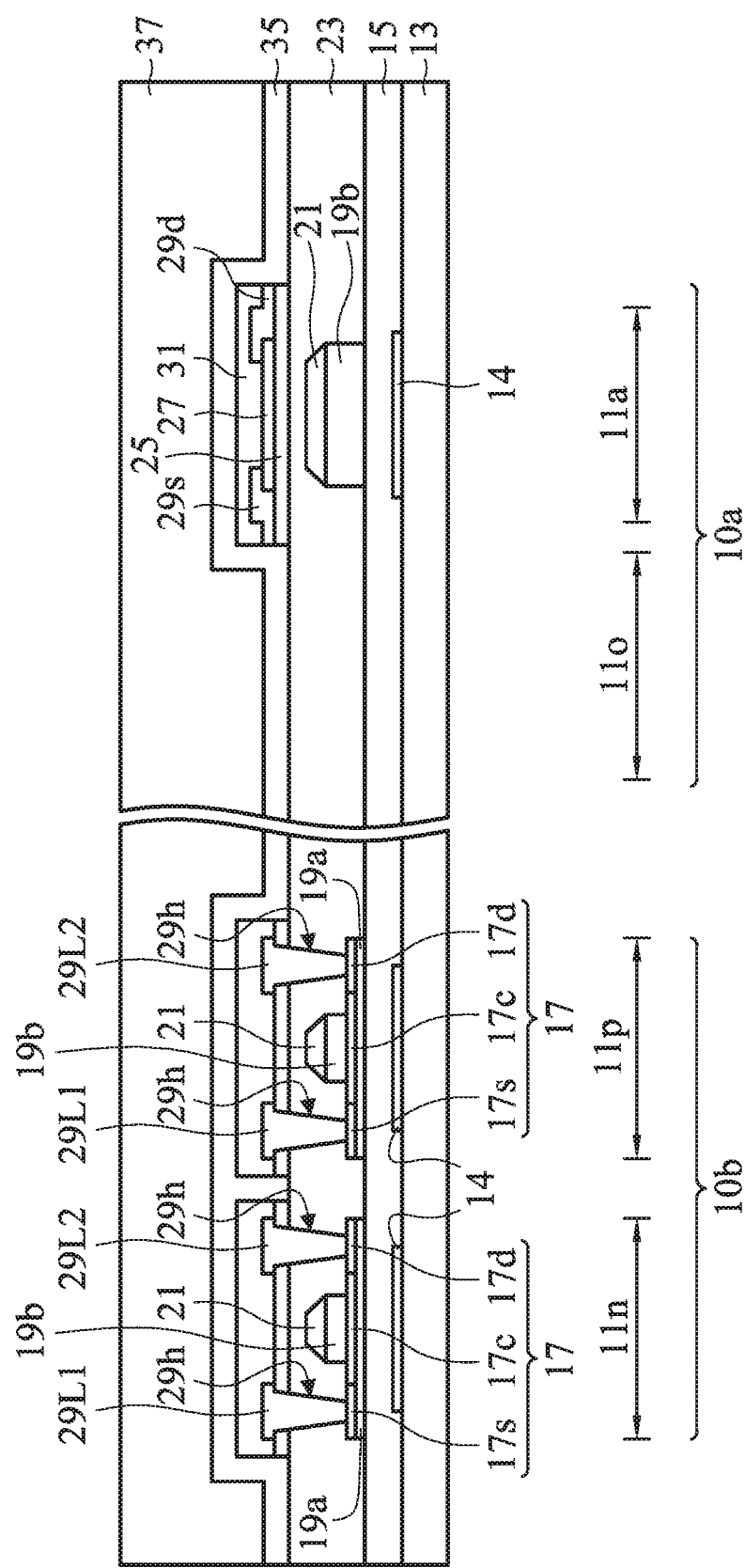
Figure 9J:
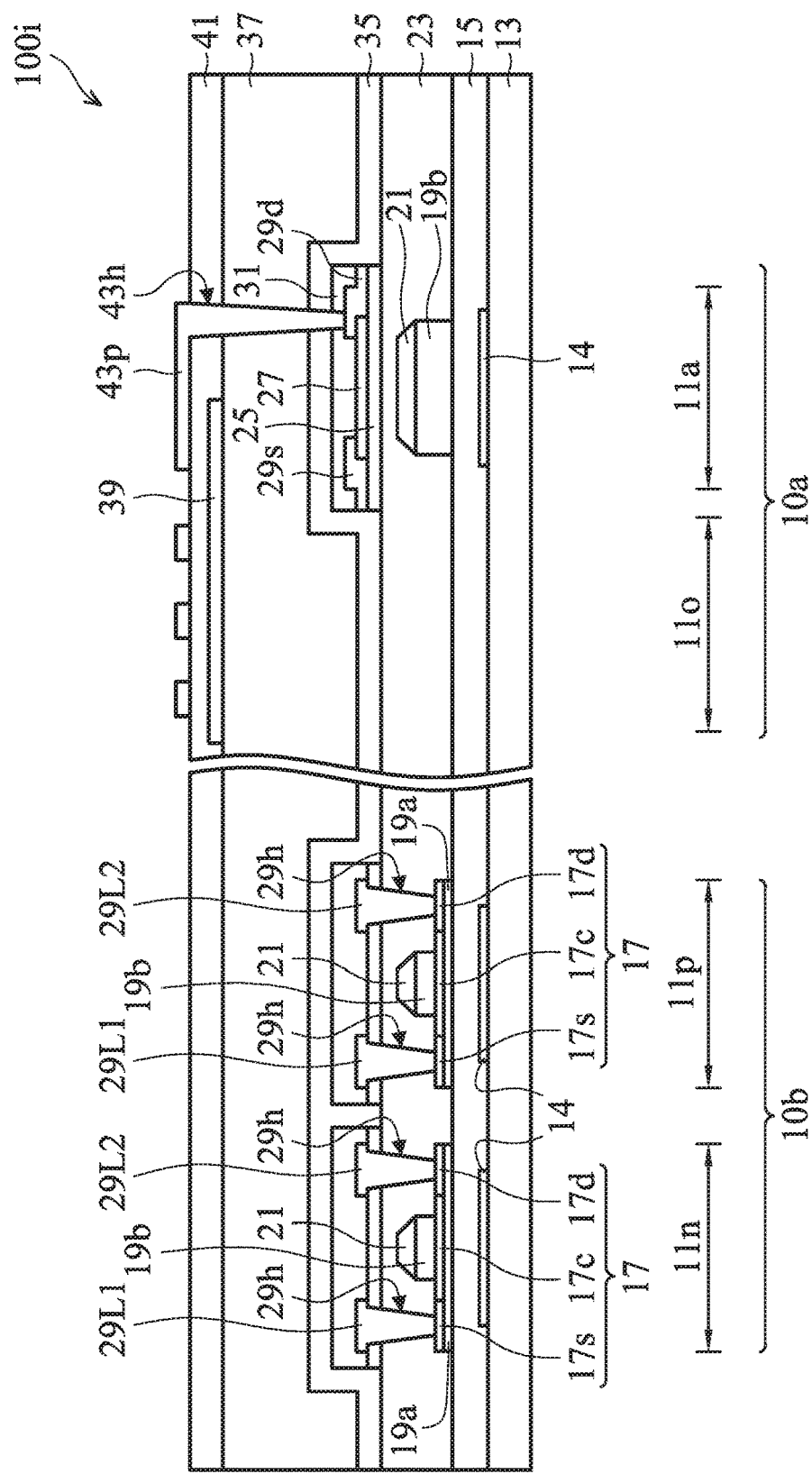

As shown in FIG. 9I, the photoresist pattern 30 is then removed. An insulating layer 35 is then formed over the insulating layer 31, and in the opening 33 to contact the ILD layer 23. An organic insulating layer 37 is then formed over the insulating layer 35. As shown in FIG. 9J, a common electrode 39 is then formed over the organic insulating layer 37. The common electrode 39 mainly corresponds to the pixel region 10a. An insulating layer 41 is then formed over the common electrode 39 and the organic insulating layer 37. The insulating layer 41, the organic insulating layer 37, the insulating layer 35, and the insulating layer 31 are patterned by lithography and etching to form a hole. Transparent conductive material such as ITO is filled into the hole. A layer of the transparent conductive material is then formed over the insulating layer 41, and then the transparent conductive material is patterned by lithography and etching to define a pixel electrode 43p. The array substrate structure 100i is therefore obtained.

In FIG. 9J, the polysilicon transistors 11n and 11p in the driving circuit 10b belong to a top gate structure, and the metal oxide semiconductor transistor 11a in the pixel region 10a belongs to a bottom gate structure. The silicon oxide layer (e.g. the ILD 25) between the metal oxide semiconductor layer 27 and the gate electrode 21, and the silicon oxide layer e.g. the insulating layer 31) on the metal oxide semiconductor layer 27 have an opening 33 corresponding to the aperture region 11o, as shown in FIG. 9J. As such, the number of the interface between the silicon oxide layer and the silicon nitride layer in the aperture region 11o can be reduced, thereby improving the light transmittance of the array substrate structure 100i.

Figure 10A:
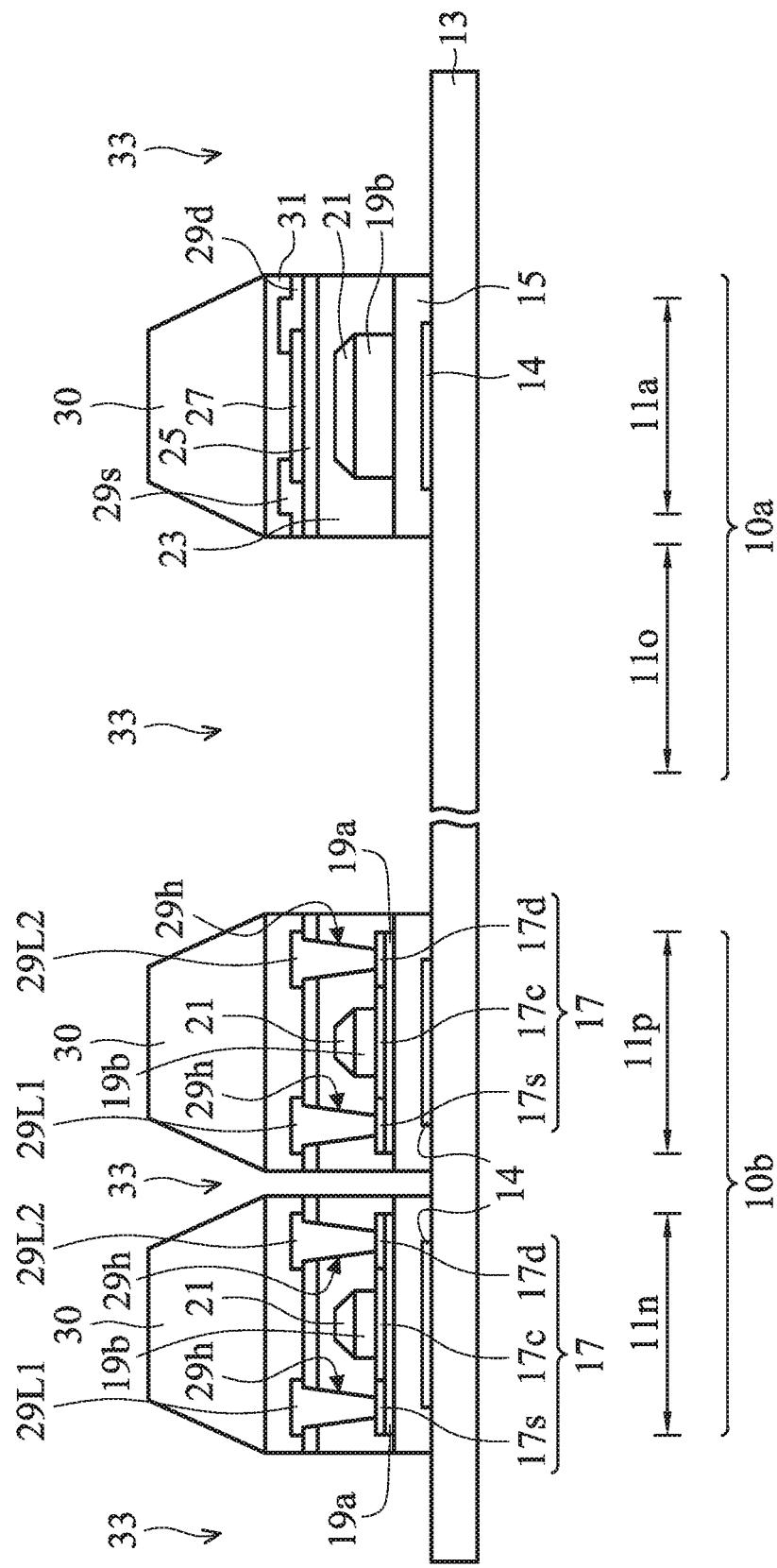
Figure 10B:
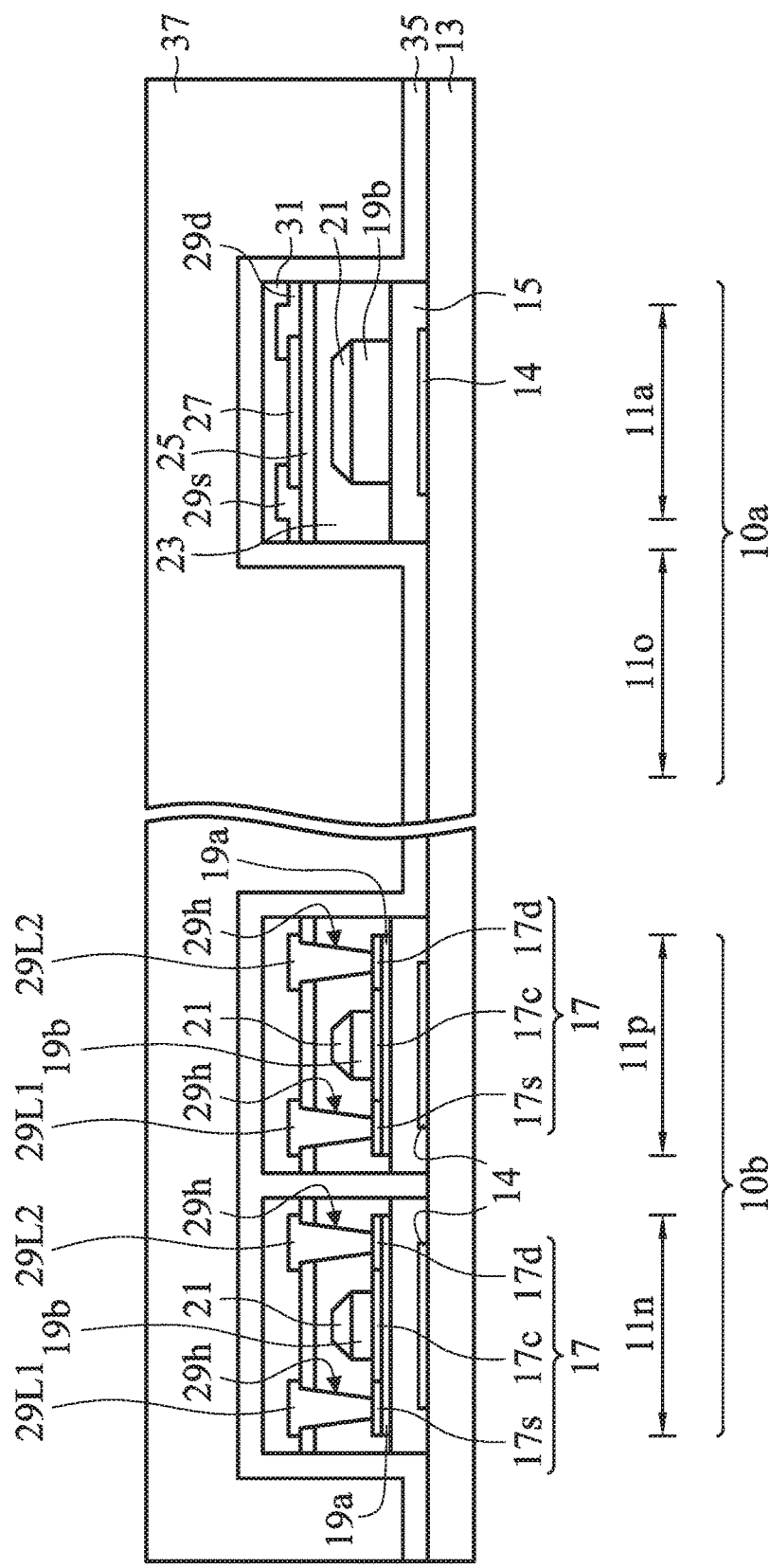
Figure 10C:
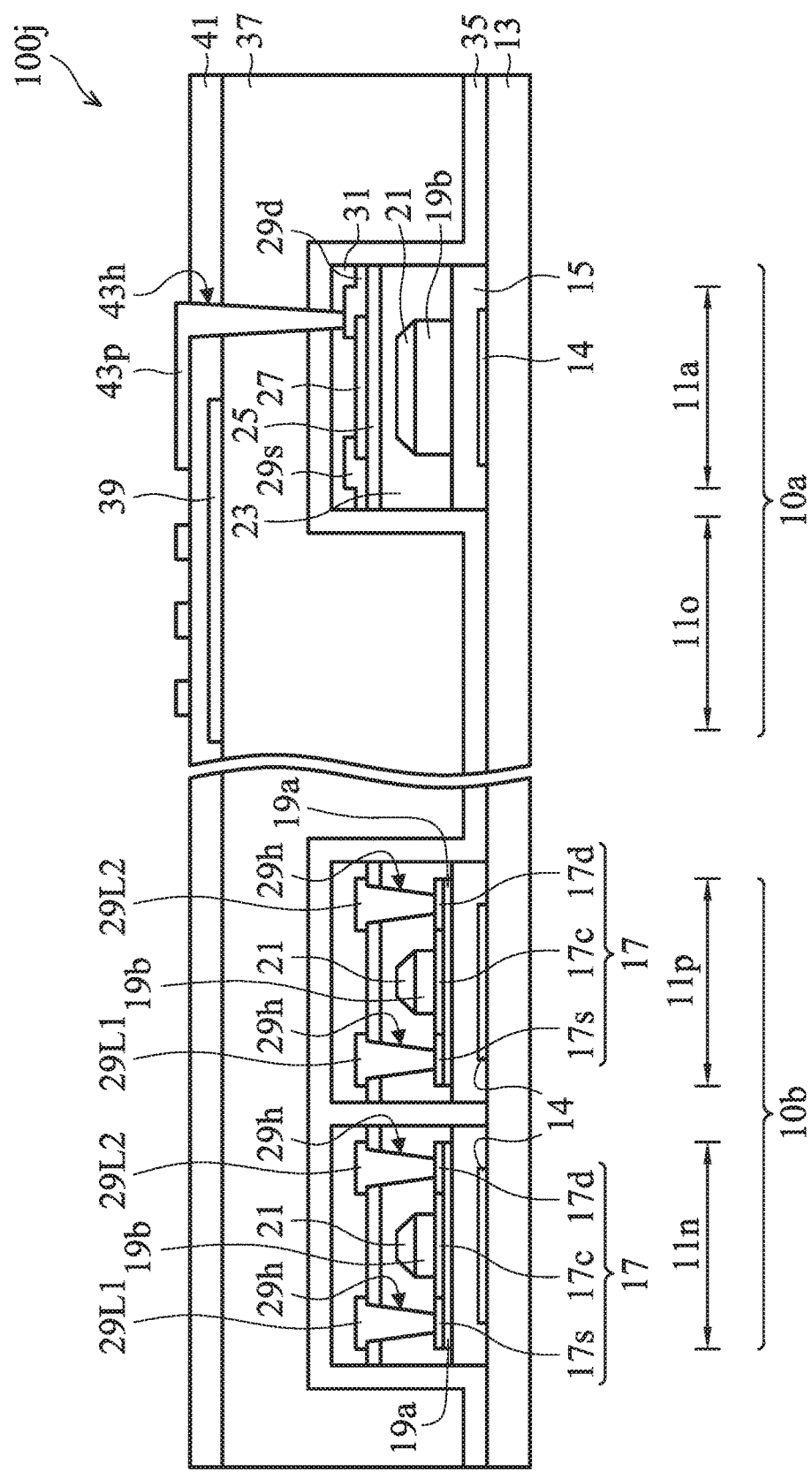

In one embodiment, cross-sectional views of processes for manufacturing an array substrate structure 100j are shown in FIGS. 10A to 10C. FIG. 10A follows the structure in FIG. 9G, in which the photoresist pattern 30 is used as an etching mask, and the insulating layer 31, the ILD layer 25, the ILD layer 23, and the buffer layer 15 not covered by the photoresist pattern 30 are etched and removed to form an opening 33 exposing parts of the substrate 13. As shown in FIG. 10A, the opening 33 mainly corresponds to the aperture region 11o. As shown in FIG. 10B, the photoresist pattern 30 is then removed. An insulating layer 35 is then formed over the insulating layer 31, and in the opening 33 to contact the substrate 13. An organic insulating layer 37 is then formed over the insulating layer 35. As shown in FIG. 10C, a common electrode 39 is then formed over the organic insulating layer 37. The common electrode 39 mainly corresponds to the pixel region 10a. An insulating layer 41 is then formed over the common electrode 39 and the organic insulating layer 37. The insulating layer 41, the organic insulating layer 37, the insulating layer 35, and the insulating layer 31 are patterned by lithography and etching to form a hole. Transparent conductive material such as ITO is filled into the hole. A layer of the transparent conductive material is then formed over the insulating layer 41, and then the transparent conductive material is patterned by lithography and etching to define a pixel electrode 43p. The array substrate structure 100j is therefore obtained.

In FIG. 10C, the polysilicon transistors 11n and 11p in the driving circuit 10b belong to a top gate structure, and the metal oxide semiconductor transistor 11a in the pixel region 10a belongs to a bottom gate structure. The silicon oxide layer (e.g. the ILD 25) between the metal oxide semiconductor layer 27 and the gate electrode 21, and the silicon oxide layer e.g. the insulating layer 31) on the metal oxide semiconductor layer 27 have an opening 33 corresponding to the aperture region 11o, as shown in FIG. 10C. As such, the number of the interface between the silicon oxide layer and the silicon nitride layer in the aperture region 11o can be reduced, thereby improving the light transmittance of the array substrate structure 100j.

Figure 11A:
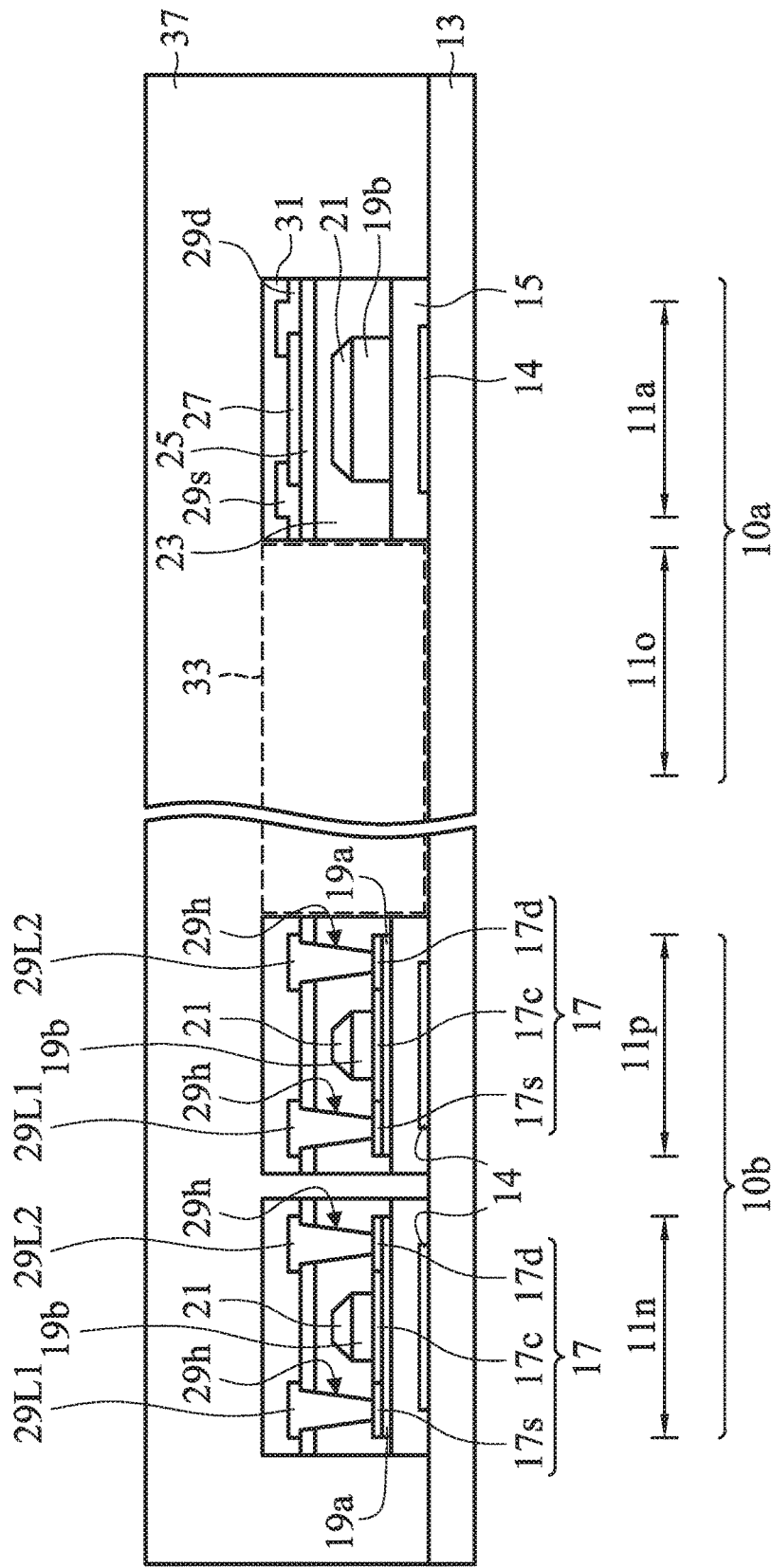
Figure 11B:
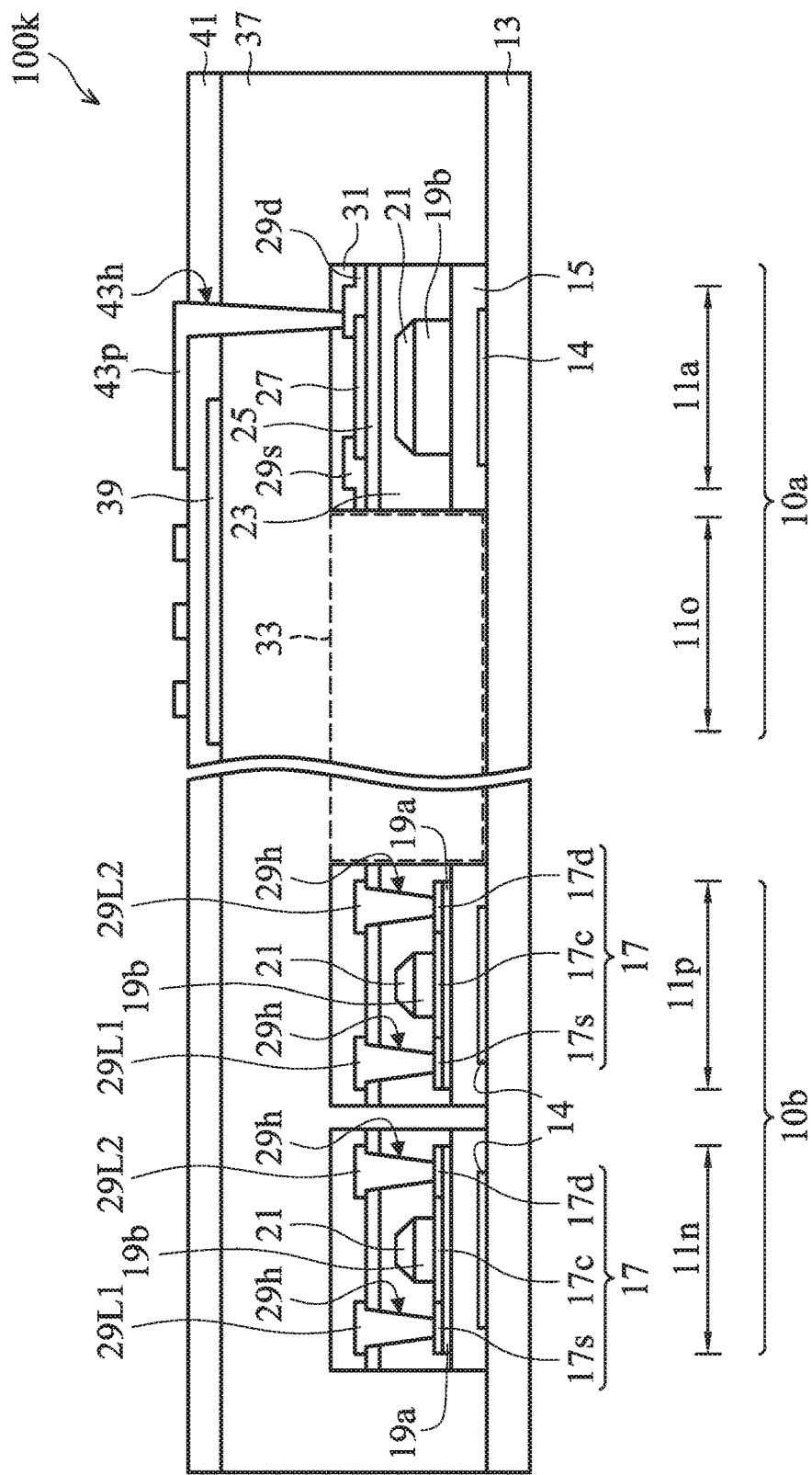

In one embodiment, cross-sectional views of processes for manufacturing an array substrate structure 100k are shown in FIGS. 11A to 11B. FIG. 11A follows the structure in FIG. 10A, in which an organic insulating layer 37 is formed over the insulating layer 31 and in the opening 33 (to contact the substrate 13). As shown in FIG. 11B, a common electrode 39 is then formed over the organic insulating layer 37. The common electrode 39 mainly corresponds to the pixel region 10a. An insulating layer 41 is then formed over the common electrode 39 and the organic insulating layer 37. The insulating layer 41, the organic insulating layer 37, and the insulating layer 31 are patterned by lithography and etching to form a hole. Transparent conductive material such as ITO is filled into the hole. A layer of the transparent conductive material is then formed over the insulating layer 41, and then the transparent conductive material is patterned by lithography and etching to define a pixel electrode 43p. The array substrate structure 100k is therefore obtained.

In FIG. 11B, the polysilicon transistors 11n and 11p in the driving circuit 10b belong to a top gate structure, and the metal oxide semiconductor transistor 11a in the pixel region 10a belongs to a bottom gate structure. The silicon oxide layer (e.g. the ILD 25) between the metal oxide semiconductor layer 27 and the gate electrode 21, and the silicon oxide layer (e.g. the insulating layer 31) on the metal oxide semiconductor layer 27 have an opening 33 corresponding to the aperture region 11o, as shown in FIG. 11B. As such, the aperture region 11o is free of the silicon oxide layer to reduce the total reflection, thereby improving the light transmittance of the array substrate structure 100k.

Figure 12:
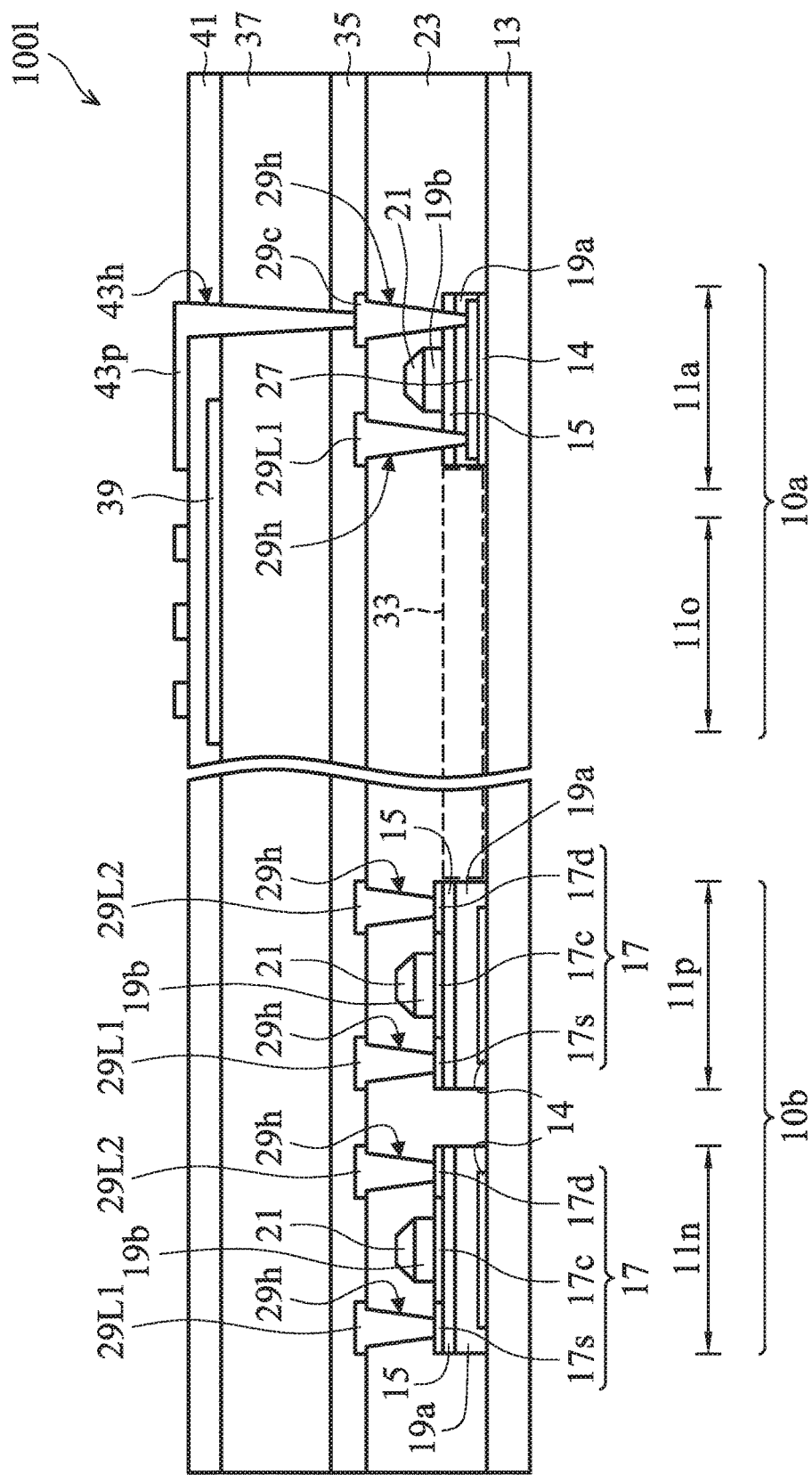

In one embodiment, a cross-sectional view of an array substrate structure 100l is shown in FIG. 12. In FIG. 12, the relative locations of the pixel region 10a, the driving circuit 10b, the metal oxide semiconductor transistor 11a, the aperture region 11o, and the polysilicon transistors 11n and 11p are similar to those in FIG. 1. Light shielding layers 14 are disposed over the substrate 13 to correspond to the polysilicon layers 17 of the polysilicon transistors 11n and 11p. The light shielding layer 14 is disposed over the substrate 13 to correspond to the metal oxide semiconductor layer 27 of the metal oxide semiconductor transistor 11a.

A metal oxide semiconductor layer 27 is disposed over the light shielding layer 14 of the metal oxide semiconductor transistor 11a. A buffer layer 19a is disposed over the light shielding layers 14 of the polysilicon transistors 11n and 11p, the substrate 13, and the metal oxide semiconductor layer 27. A buffer layer 15 is disposed over the buffer layer 19a. Polysilicon layers 17 (such as the source regions 17s, the channel regions 17c, and the drain regions 17d) are disposed over the buffer layer 15 to correspond to the polysilicon transistors 11n and 11p. Buffer layers 19b are disposed over the channel regions 17c of the polysilicon transistors 11n and 11p, and the buffer layer 15 of the metal oxide semiconductor transistor 11a. Gate electrodes 21 are disposed over the buffer layers 19b. For the polysilicon transistors 11n and 11p, the gate electrodes 21 correspond to the channel regions 17c, and gate insulation layers such as the buffer layers 19b are disposed therebetween. For the metal oxide semiconductor transistor 11a, the gate electrode 21 corresponds to the channel region (the metal oxide semiconductor layer 27), and a gate insulation layer such as the buffer layers 19b, 15, and 19a are disposed therebetween.

The buffer layers 15 and 19a have an opening 33 corresponding to the aperture region 11o. The opening 33 can be formed by lithographs and etching. Note that the exposure step in the lithography can be performed by exposing from the bottom, in which the light shielding layers 14, the source lines 29L1, and the drain lines 29L2 serve as the photomask, thereby omitting a photomask to reduce the cost. After the lithography with the exposure from bottom to top and etching, edges of the buffer layers 15 and 19a (silicon oxide layers) will be corresponded to an edge of the mask.

An ILD layer 23 is disposed over the gate electrodes 21, the source regions 17s, the drain regions 17d, and the buffer layer 15. The ILD layer 23 is in direct contact with the substrate 13 through the opening 33. Source lines 29L1, drain lines 29L2, and a contact 29c are disposed over the ILD layer 23. The source lines 29L1 of the polysilicon transistors 11n and 11p are disposed over the source regions 17s, and the source lines 29L1 are connected to the source regions 17s by vias 29h penetrating through the ILD layer 23. The drain lines 29L2 of the polysilicon transistors 11n and 11p are disposed over the drain regions 17d, and the drain lines 29L2 are connected to the drain regions 17d by vias 29h penetrating through the ILD layer 23. The source line 29L1 of the metal oxide semiconductor transistor 11a is disposed over one side of the metal oxide semiconductor layer 27, and the source line 29L1 is connected to one side of the metal oxide semiconductor layer 27 by a via 29h penetrating through the ILD layer 23, the buffer layer 15, and the buffer layer 19a. The contact 29c of the metal oxide semiconductor transistor 11a is disposed over another side of the metal oxide semiconductor layer 27, and the contact 29c is connected by a via 29h penetrating through the ILD layer 23, the buffer layer 15, and the buffer layer 19a.

An insulating layer 35 is disposed over the source lines 29L1, the drain lines 29L2, the contact 29c, and the ILD layer 23. An organic insulating layer 37 is disposed over the insulating layer 35. A common electrode 39 is disposed over the organic insulating layer 37. The common electrode 39 mainly corresponds to the pixel region 10a. An insulating layer 41 is disposed over the common electrode 39 and the organic insulating layer 37. A pixel electrode 43p is disposed over the insulating layer 41. A part of the pixel electrode 43p is disposed over the contact 29c, and the pixel electrode 43p is connected to the contact 29c by a via 43h penetrating through the insulating layer 41, the organic insulating layer 37, and the insulating layer 35. In FIG. 12, the polysilicon transistors 11n and 11p in the driving circuit 10b belong to a top gate structure, and the metal oxide semiconductor transistor 11a in the pixel region 10a belongs to a top gate structure. The silicon oxide layer (e.g. the buffer layer 19a) between the metal oxide semiconductor layer 27 and the gate electrode 21 has an opening 33 corresponding to the aperture region 11o, as shown in FIG. 12. As such, the number of the interface between the silicon oxide layer and the silicon nitride layer in the aperture region 11o can be reduced, thereby improving the light transmittance of the array substrate structure 100l.

Figure 13:
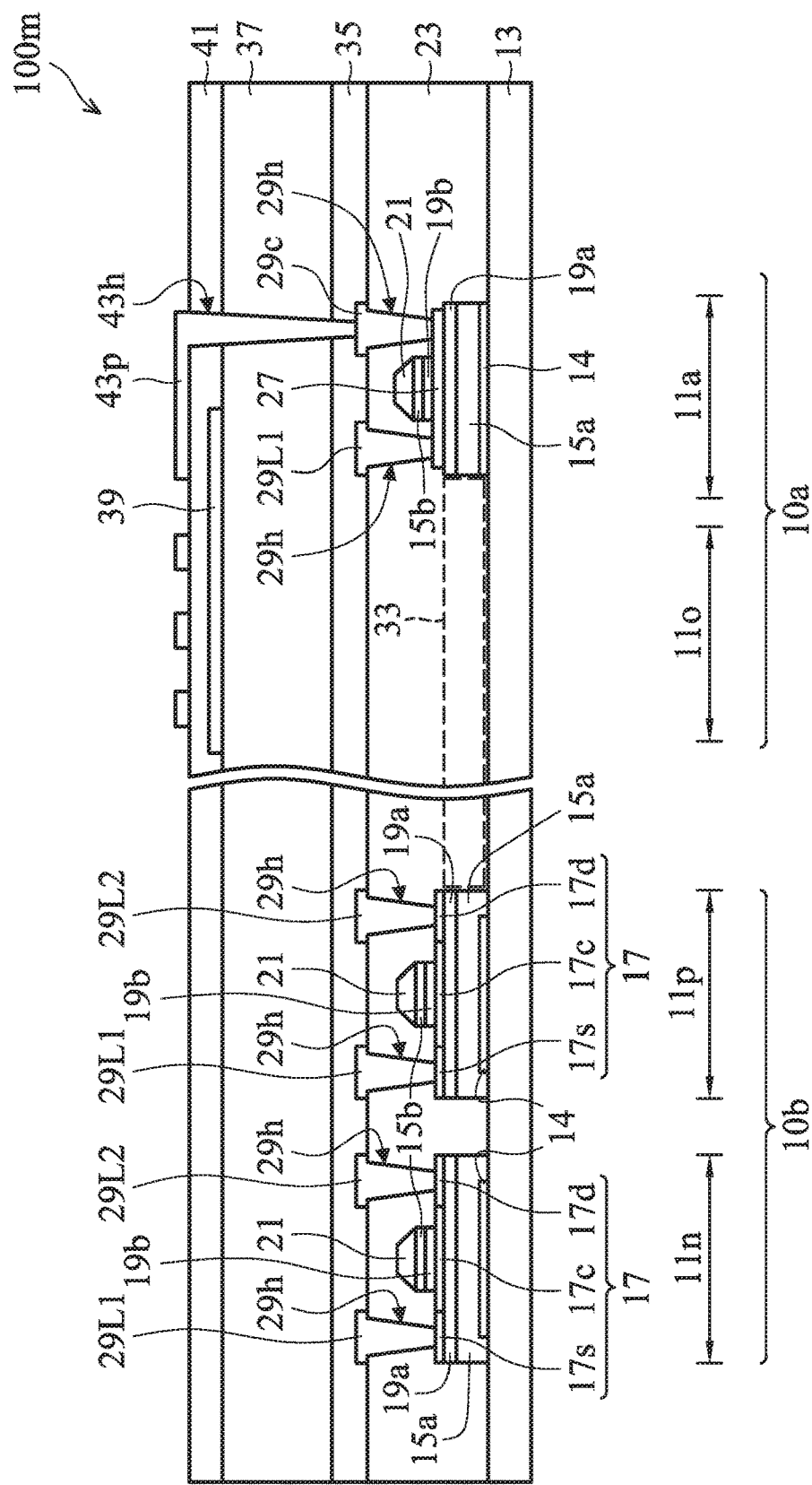

In one embodiment, a cross-sectional view of an array substrate structure 100m is shown in FIG. 13. In FIG. 13, the relative locations of the pixel region 10a, the driving circuit 10b, the metal oxide semiconductor transistor 11a, the aperture region 11o, and the polysilicon transistors 11n and 11p are similar to those in FIG. 1. Light shielding layers 14 are disposed over the substrate 13 to correspond to the polysilicon layers 17 of the polysilicon transistors 11n and 11p. The light shielding layer 14 is disposed over the substrate 13 to correspond to the metal oxide semiconductor layer 27 of the metal oxide semiconductor transistor 11a.

A buffer layer 15a is disposed over the light shielding layers 14 of the polysilicon transistors 11n and 11p, and the substrate 13. The buffer layer 15a can be formed by CVD and can comprise silicon nitride, and is not limited thereto. A buffer layer 19a is disposed over the buffer layer 15a. Polysilicon layers 17 (such as the source regions 17s, the channel regions 17c, and the drain regions 17d) are disposed over the buffer layer 19a to correspond to the polysilicon transistors 11n and 11p. A metal oxide semiconductor layer 27 is disposed over the buffer layer 19a of the metal oxide semiconductor transistor 11a. Buffer layers 19b are disposed over the channel regions 17c and the metal oxide semiconductor layer 27. Buffer layers 15b are disposed over the buffer layers 19b. The buffer layers 15b can be formed by CVD and can comprise silicon nitride, and is not limited thereto. Gate electrodes 21 are disposed over the buffer layers 15b. For the polysilicon transistors 11n and 11p, the gate electrodes 21 correspond to the channel regions 17c, and gate insulation layers such as the buffer layers 15b and 19b are disposed therebetween. For the metal oxide semiconductor transistor 11a, the gate electrode 21 corresponds to the channel region (the metal oxide semiconductor layer 27), and a gate insulation layer such as the buffer layers 15b and 19b are disposed therebetween.

The buffer layers 19a and 15a have an opening 33 corresponding to the aperture region 11o. The opening 33 can be formed by lithography and etching. An ILD layer 23 is disposed over the substrate 13, the gate electrodes 21, the source regions 17s, the drain regions 17d, and both sides of the metal oxide semiconductor layers 27. Source lines 29L1, drain lines 29L2, and a contact 29c are disposed over the ILD 23. The source lines 29L1 of the polysilicon transistors 11n and 11p are disposed over the source regions 17s, and the source lines 29L1 are connected to the source regions 17s by vias 29h penetrating through the ILD layer 23. The drain lines 29L2 of the polysilicon transistors 11n and 11p are disposed over the drain regions 17d, and the drain lines 29L2 are connected to the drain regions 17d by vias 29h penetrating through the ILD layer 23. The source line 29L1 of the metal oxide semiconductor transistor 11a is disposed over one side of the metal oxide semiconductor layer 27, and the source line 29L1 is connected to one side of the metal oxide semiconductor layer 27 by a via 29h penetrating through the ILD layer 23. The contact 29c of the metal oxide semiconductor transistor 11a is disposed over another side of the metal oxide semiconductor layer 27, and the contact 29c is connected to another side of the metal oxide semiconductor layer 27 by a via 29h penetrating through the ILD layer 23.

An insulating layer 35 is disposed over the source lines 29L1, the drain lines 29L2, the contact 29c, and the ILD layer 23. An organic insulating layer 37 is disposed over the insulating layer 35. A common electrode 39 is disposed over the organic insulating layer 37. The common electrode 39 mainly corresponds to the pixel region 10a. An insulating layer 41 is disposed over the common electrode 39 and the organic insulating layer 37. A pixel electrode 43p is disposed over the insulating layer 41. A part of the pixel electrode 43p is disposed over the contact 29c. The pixel electrode 43p is connected to the contact 29c by a via 43h penetrating through the insulating layer 41, the organic insulating layer 37, and the insulating layer 35. In FIG. 13, the polysilicon transistors 11n and 11p in the driving circuit 10b belong to a top gate structure, and the metal oxide semiconductor transistor 11a in the pixel region 10a belongs to a top gate structure. The silicon oxide layer (e.g. the buffer layer 19a) between the metal oxide semiconductor layer 27 and the gate electrode 21 has an opening 33 corresponding to the aperture region 11o, as shown in FIG. 13. As such, the number of the interface between the silicon oxide layer and the silicon nitride layer in the aperture region 11o can be reduced, thereby improving the light transmittance of the array substrate structure 100m.

Figure 14:
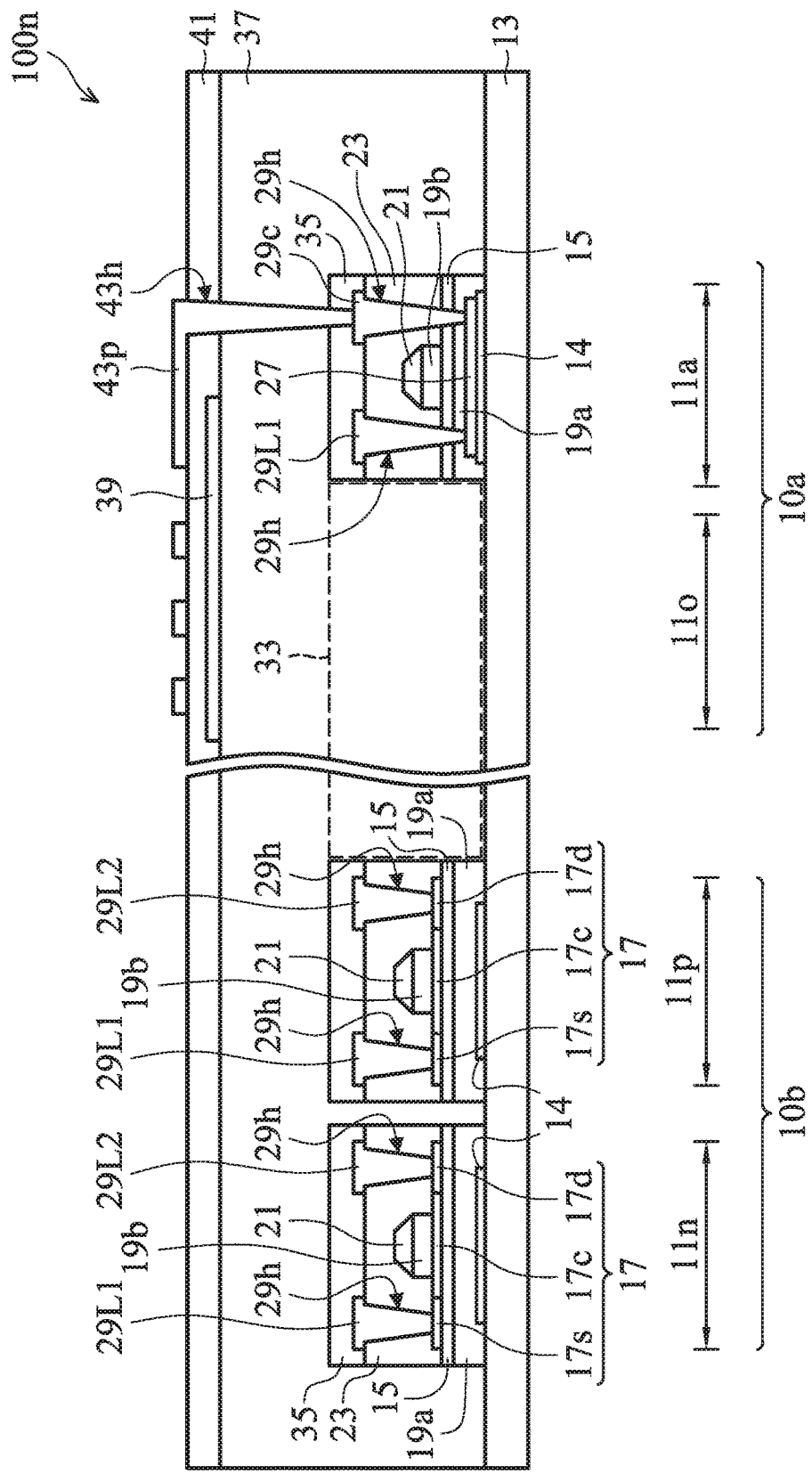

The array substrate structure 100n in FIG. 14 is similar to that in FIG. 12, and the difference in FIG. 14 is that the insulating layer 35 and the ILD layer 23 also have an opening 33 (corresponded to the opening of the buffer layers 15 and 19a). As such, the organic insulating layer 37 contacts the substrate 13 through the opening 33.

Figure 15:
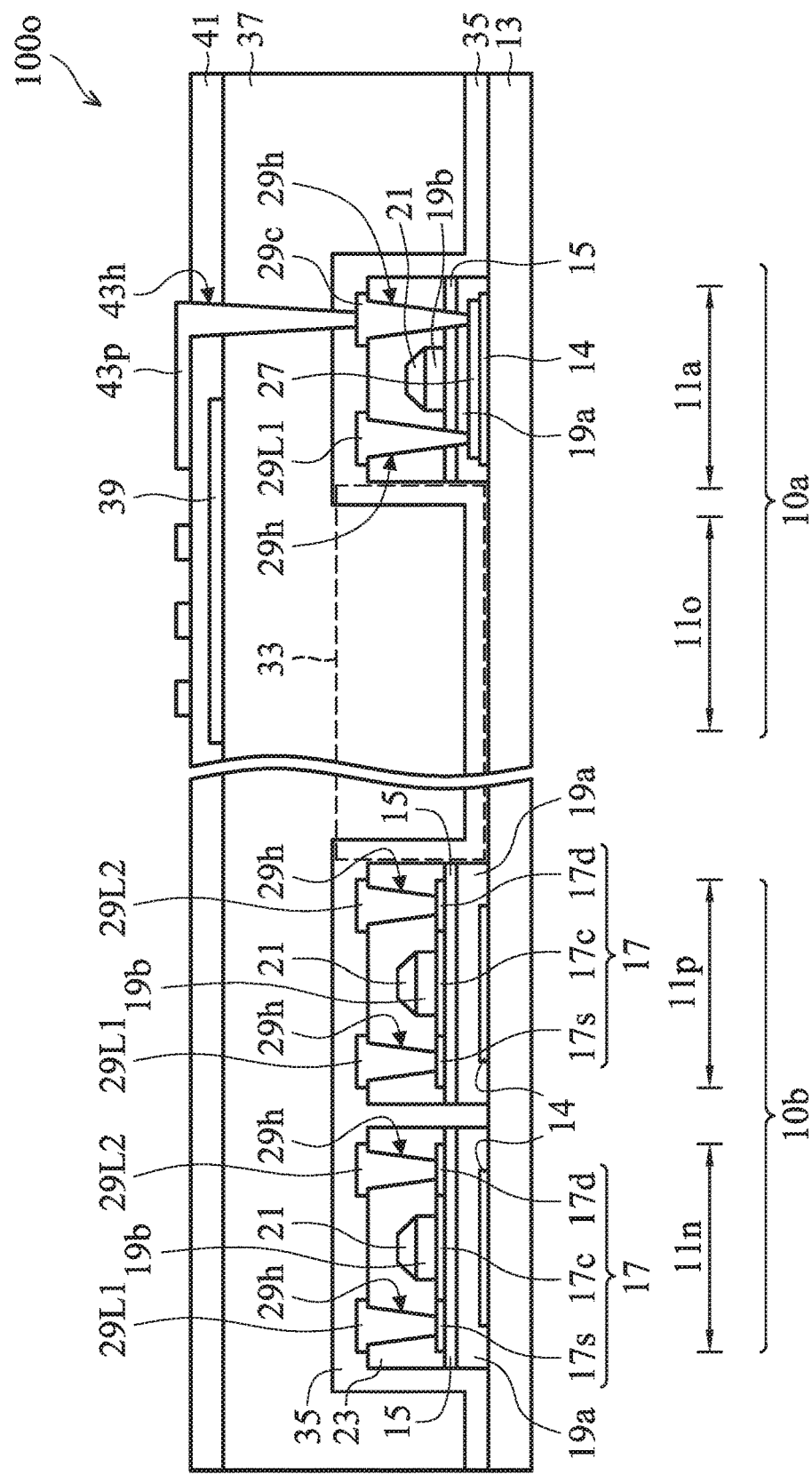

The array substrate structure 100o in FIG. 15 is similar to that in FIG. 12, and the difference in FIG. 15 is that the ILD layer 23 also has an opening 33 (corresponded to the opening of the buffer layers 15 and 19a). As such, the insulating layer 35 contacts the substrate 13 through the opening 33.

Figure 16:
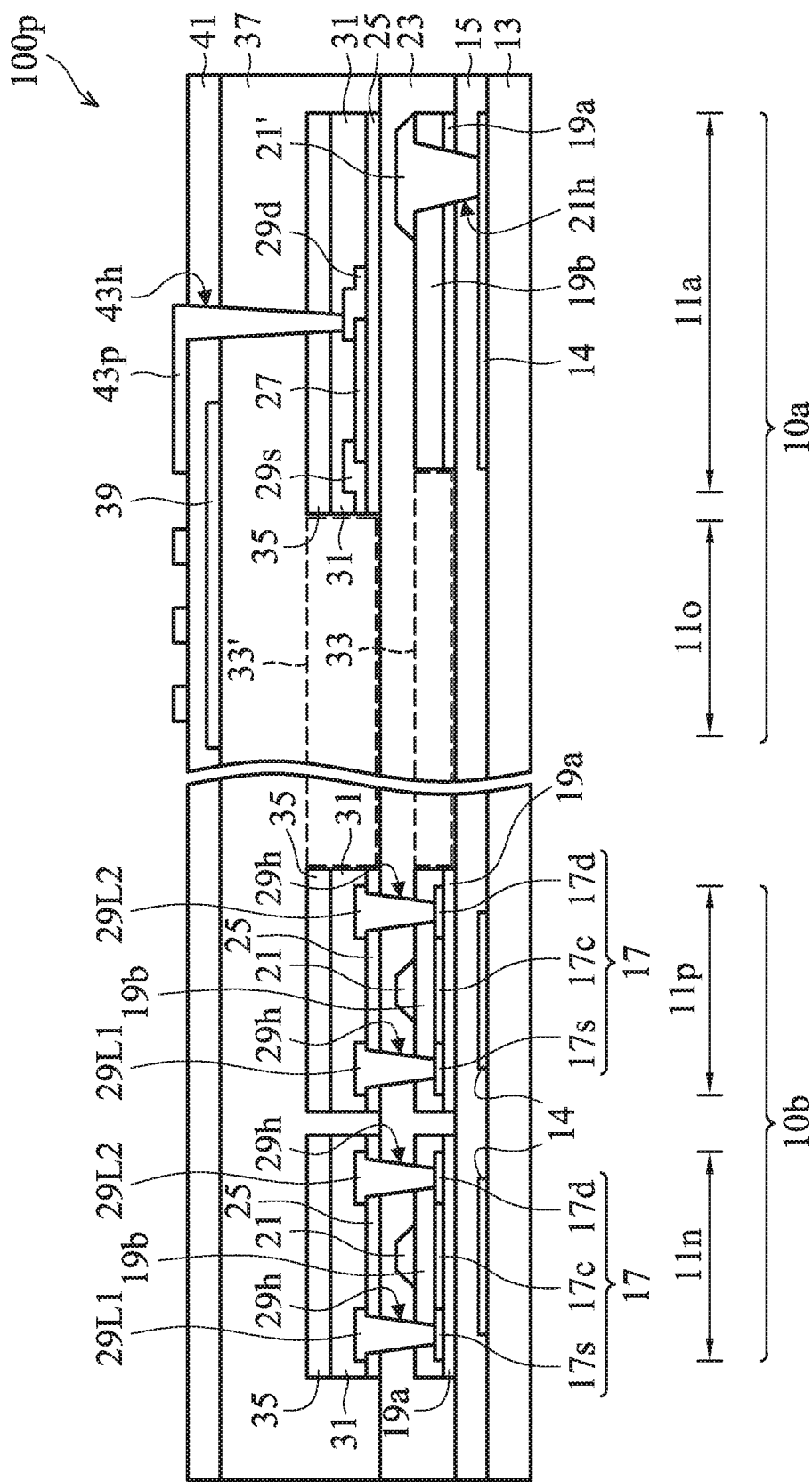

In one embodiment, a cross-sectional view of an array substrate structure 100p is shown in FIG. 16. In FIG. 16, the relative locations of the pixel region 10a, the driving circuit 10b, the metal oxide semiconductor transistor 11a, the aperture region 11o, and the polysilicon transistors 11n and 11p are similar to those in FIG. 1. Light shielding layers 14 are disposed over the substrate 13 to correspond to the polysilicon layers 17 of the polysilicon transistors 11n and 11p. The light shielding layer 14 is disposed over the substrate 13 to correspond to the metal oxide semiconductor layer 27 of the metal oxide semiconductor transistor 11a. In this embodiment, the light shielding layer 14 of the metal oxide semiconductor transistor 11a also serves as the gate electrode of the metal oxide semiconductor transistor 11a, so the light shielding layers 14 must comprise a conductive material such as metal. The light shielding layers 14 can be formed by deposition and then patterned by lithography and etching.

A buffer layer 15 is disposed over the light shielding layers 14 and the substrate 13. A buffer layer 19a is disposed over the buffer layer 15, and polysilicon layers 17 (such as the source regions 17s, the channel regions 17c, and the drain regions 17d) are disposed over the buffer layer 19a to correspond to the polysilicon transistors 11n and 11p. Buffer layers 19b are disposed over the polysilicon layers 17 and the buffer layer 19a, and gate electrodes 21 and gate line 21' are disposed over the buffer layers 19b. For the polysilicon transistors 11n and 11p, the gate electrodes 21 is disposed over the channel regions 17c, and gate insulation layers such as the buffer layers 19b are disposed therebetween. For the metal oxide semiconductor transistor 11a, the gate line 21' and the light shielding layer 14 are connected by a via 21h penetrating through the buffer layers 19b, 19a, and 15. The buffer layers 19a and 19b have an opening 33 corresponding to the aperture region 11o. An ILD layer 23 is disposed over the gate electrodes 21, the gate line 21', and the buffer layer 19b. The ILD layer 23 is in direct contact with the buffer layer 15 through the opening 33 of the buffer layers 19a and 19b.

An ILD layer 25 is disposed over the ILD layer 23. A metal oxide semiconductor layer 27 is disposed over the ILD layer 25 to correspond to the gate electrode (the light shielding layer 14) of the metal oxide semiconductor transistor 11a. For the metal oxide semiconductor transistor 11a, the gate insulation layer between the channel region (the metal oxide semiconductor layer 27) and the gate electrode (the light shielding layer 14) is the ILD layer 25, the ILD layer 23, the buffer layer 19b, the buffer layer 19a, and the buffer layer 15. Source lines 29L1, drain lines 29L2, a source electrode 29s, and a drain electrode 29d are disposed over the ILD 25. The source lines 29L1 are disposed over the source regions 17s, and the source lines 29L1 are connected to the source regions 17s by vias 29h penetrating through the ILD layer 25, the ILD layer 23, and the buffer layer 19b. The drain lines 29L2 are disposed over the drain regions 17d, and the drain lines 29L2 are connected to the drain regions 17d by vias 29h penetrating through the ILD layer 25, the ILD layer 23, and the buffer layer 19b. The source electrode 29s and the drain electrode 29d are disposed over both sides of the metal oxide semiconductor layer 27.

An insulating layer 31 is disposed over the source lines 29L1, the drain lines 29L2, the source electrode 29s, the drain electrode 29d, the metal oxide semiconductor layer 27, and the ILD layer 25. An insulating layer 35 is disposed over the insulating layer 31. The insulating layer 35, the insulating layer 31, and the ILD layer 25 have an opening 33' corresponding to the aperture region 11o. The opening 33' can be formed by lithography and etching. Note that the exposure step in the lithography can be performed by exposing from the bottom, in which the light shielding layers 14, the source lines 29L1, the drain lines 29L2, and the source electrode 29s serve as the photomask, thereby omitting a photomask to reduce the cost. After the lithography by exposing from the bottom and etching, edges of the silicon oxide layers such as the insulating layer 31 and the ILD layer 25 will be corresponded to an edge of the mask.

An organic insulating layer 37 is disposed over the insulating layer 35. The organic insulating layer 37 contacts the ILD layer 23 through the opening 33' of the insulating layer 35, the insulating layer 31, and the ILD layer 25. A common electrode 39 is disposed over the organic insulating layer 37. The common electrode 39 mainly corresponds to the pixel region 10a. An insulating layer 41 is disposed over the common electrode 39 and the organic insulating layer 37. A pixel electrode 43p is disposed over the insulating layer 41. A part of the pixel electrode 43p is disposed over the drain electrode 29d, and the pixel electrode 43p is connected to the drain electrode 29d by a via 43h penetrating through the insulating layer 41, the organic insulating layer 37, the insulating layer 35, and the insulating layer 31. In FIG. 16, the polysilicon transistors 11n and 11p in the driving circuit 10b belong to a top gate structure, and the metal oxide semiconductor transistor 11a in the pixel region 10a belongs to a bottom gate structure. The silicon oxide layers (e.g. the ILD layer 25, the buffer layer 19a, and the buffer layer 19b) between the metal oxide semiconductor layer 27 and the light shielding layer 14, and the silicon oxide layer (e.g. the insulating layer 31) on the metal oxide semiconductor layer 27 have openings 33 and 33' corresponding to the aperture region 11o, as shown in FIG. 16. As such, the number of the interface between the silicon oxide layer and the silicon nitride layer in the aperture region 11o can be reduced, thereby improving the light transmittance of the array substrate structure 110p.

Figure 17:
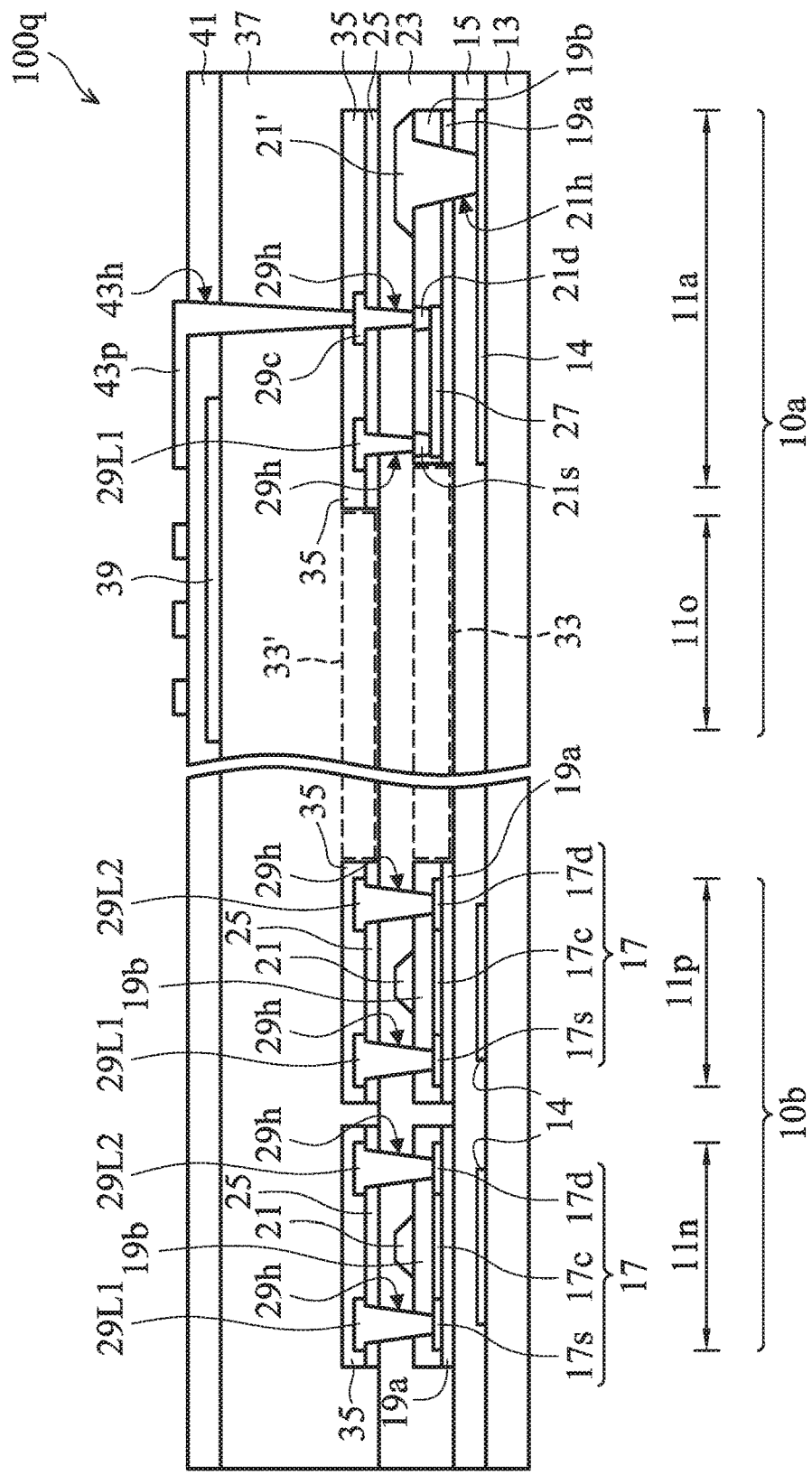

In one embodiment, a cross-sectional view of an array substrate structure 100g is shown in FIG. 17. In FIG. 17, the relative locations of the pixel region 10a, the driving circuit 10b, the metal oxide semiconductor transistor 11a, the aperture region 11o, and the polysilicon transistors 11n and 11p are similar to those in FIG. 1. Light shielding layers 14 are disposed over the substrate 13 to correspond to the polysilicon layers 17 of the polysilicon transistors 11n and 11p. The light shielding layer 14 is disposed over the substrate 13 to correspond to the metal oxide semiconductor layer 27 of the metal oxide semiconductor transistor 11a. In this embodiment, the light shielding layer 14 of the metal oxide semiconductor transistor 11a also serves as the gate electrode of the metal oxide semiconductor transistor 11a, so the light shielding layers 14 must comprise a conductive material such as metal.

A buffer layer 15 is disposed over the light shielding layers 14 and the substrate 13, and a buffer layer 19a is disposed over the buffer layer 15. Polysilicon layers 17 (such as the source regions 17s, the channel regions 17c, and the drain regions 17d) are disposed over the buffer layer 19a to correspond to the polysilicon transistors 11n and 11p. A metal oxide semiconductor layer 27 is disposed over the buffer layer 19a to correspond to the gate electrode (the light shielding layer 14) of the metal oxide semiconductor transistor 11a.

Buffer layers 19b are disposed over the polysilicon layers 17, the metal oxide semiconductor layer 27, and the buffer layer 19a. A source electrode 21s and a drain electrode 21d penetrate through the buffer layer 19b to contact both sides of the metal oxide semiconductor layer 27. For the polysilicon transistors 11n and 11p, the gate electrodes 21 are disposed over the channel regions 17c, and gate insulating layers such as the buffer layers 19b are disposed therebetween. For the metal oxide semiconductor transistor 11a, the gate insulating layer between the channel region (the metal oxide semiconductor layer 27) and the gate electrode (the light shielding layer 14) is the buffer layer 19a and the buffer layer 15. In the metal oxide semiconductor transistor 11a, the gate line 21' and the light shielding layer 14 are connected by a via 21h penetrating trough the buffer layers 19b, 19a, and 15. The buffer layers 19a and 19b have an opening 33 corresponding to the aperture region 11o. ILD layer 23 is disposed over the gate electrodes 21, the gate line 21', and the buffer layer 19b. The ILD layer 23 is in direct contact with the buffer layer 15 through the opening 33 of the buffer layers 19a and 19b.

An ILD layer 25 is disposed over the ILD layer 23. Source lines 29L1, drain lines 29L2, and a contact 29c are disposed over the ILD 25. The source lines 29L1 of the polysilicon transistors 11n and 11p are disposed over the source regions 17s, and the source lines 29L1 are connected to the source regions 17s by vias 29h penetrating through the ILD layer 25, the ILD layer 23, and the buffer layer 19b. The drain lines 29L2 of the polysilicon transistors 11n and 11p are disposed over the drain regions 17d, and the drain lines 29L2 are connected to the drain regions 17d by vias 29h penetrating through the ILD layer 25, the ILD layer 23, and the buffer layer 19b. The source line 29L1 of the metal oxide semiconductor transistor 11a is disposed over the source electrode 21s, and the source line 29L1 is connected to the source electrode 21s by a via 29h penetrating through the ILD layer 25 and the ILD layer 23. The contact 29c of the metal oxide semiconductor transistor 11a is disposed over the drain electrode 21d, and the contact 29c is connected to the drain electrode 21d by a via 29h penetrating through the ILD layer 25 and the ILD layer 23.

An insulating layer 35 is disposed over the ILD layer 25. The insulating layer 35 and the ILD layer 25 have an opening 33' corresponding to the aperture region 11o. The opening 33' can be formed by lithography and etching. Note that the exposure step in the lithography can be performed by exposing from the bottom, in which the light shielding layers 14, the source lines 29L1, and the drain lines 29L2 serve as the photomask, thereby omitting a photomask to reduce the cost. After the lithography by exposing from bottom and etching, an edge of the ILD layer 25 (silicon oxide layer) will be corresponded to an edge of the mask.

An organic insulating layer 37 is disposed over the insulating layer 35. The organic insulating layer 37 contacts the ILD layer 23 through the opening 33' of the insulating layer 35 and the ILD layer 25. A common electrode 39 is disposed over the organic insulating layer 37. The common electrode 39 mainly corresponds to the pixel region 10a An insulating layer 41 is disposed over the common electrode 39 and the organic insulating layer 37. A pixel electrode 43p is disposed over the insulating layer 41. A part of the pixel electrode 43p is disposed over the contact 29c. The pixel electrode 43p is connected to the contact 29c by a via 43h penetrating through the insulating layer 41, the organic insulating layer 37, and the insulating layer 35. In FIG. 17, the polysilicon transistors 11n and 11p in the driving circuit 10b belong to a top gate structure, and the metal oxide semiconductor transistor 11a in the pixel region 10a belongs to a bottom gate structure. The silicon oxide layer (e.g. the buffer layer 19a) between the metal oxide semiconductor layer 27 and the gate electrode (e.g. the light shielding layer 14), and the silicon oxide layers (e.g. the ILD layer 25 and the buffer layer 19b) on the metal oxide semiconductor layer 27 have openings 33 and 33' corresponding to the aperture region 11o, as shown in FIG. 17. As such, the number of the interface between the silicon oxide layer and the silicon nitride layer in the aperture region 11o can be reduced, thereby improving the light transmittance of the array substrate structure 100q.

Figure 18:
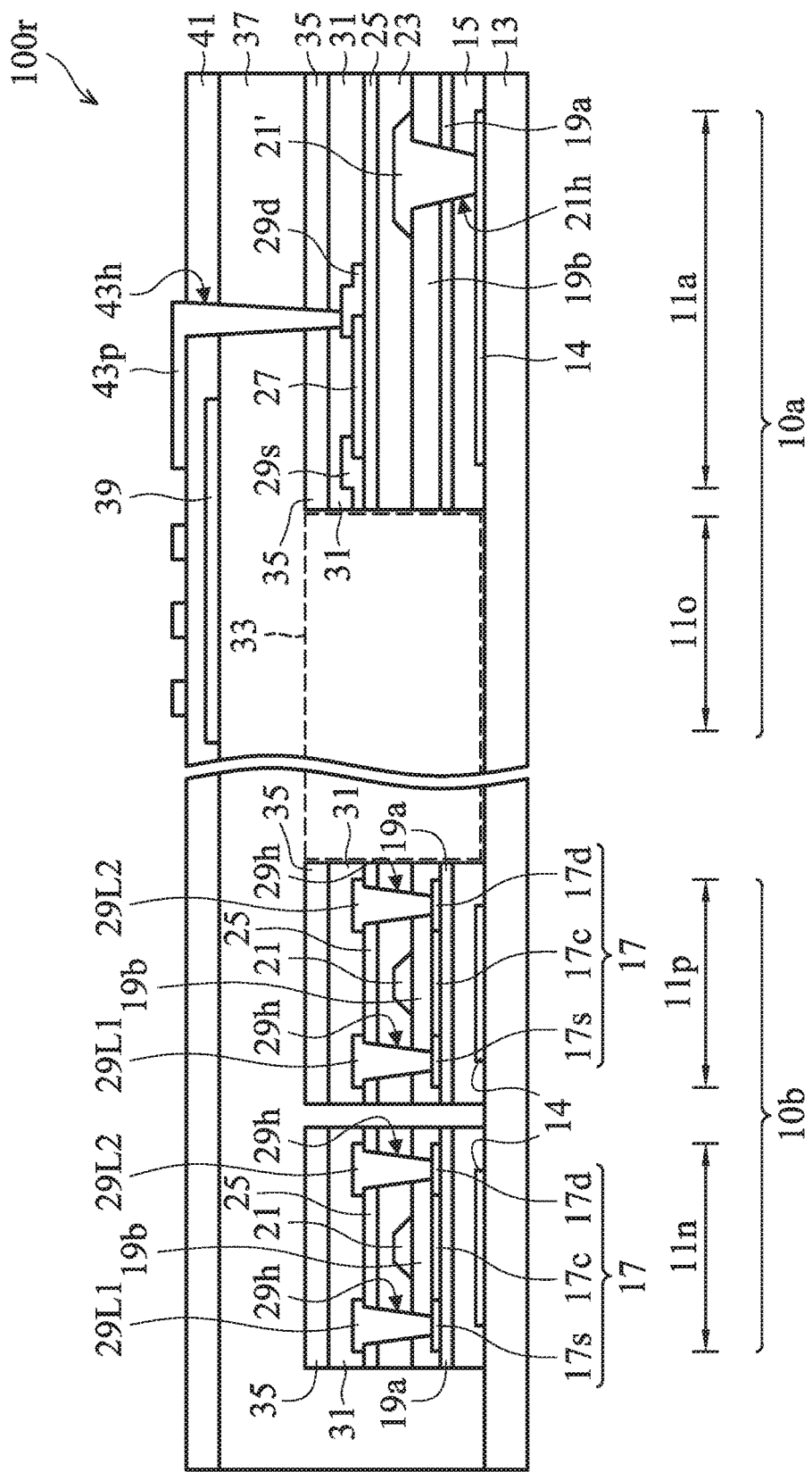

The array substrate structure 100r in FIG. 18 is similar to that in FIG. 16, and the difference in FIG. 18 is that all the buffer layers 15, 19a, and 19b, the ILD layers 23 and 25, and the insulating layers 31 and 35 have an opening 33 to correspond to the aperture region 11o. As such, the organic insulating layer 37 formed over the insulating layer 35 contacts the substrate 13 through the opening 33. In FIG. 18, the aperture region 11o is free of the interface of the silicon oxide layer and the silicon nitride layer, thereby improving the light transmittance of the array substrate structure 100r.

Figure 19:
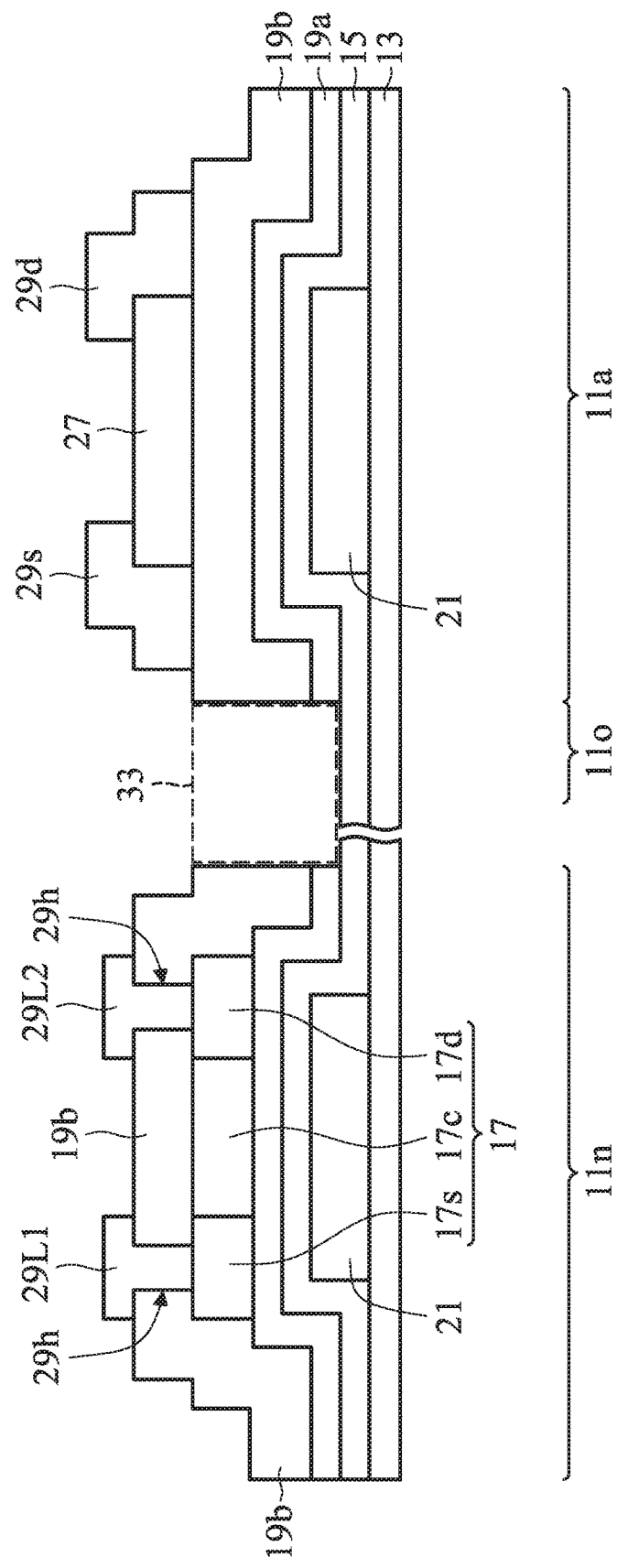

In one embodiment, a bottom gate structure is used for the polysilicon transistor 11n and the metal oxide semiconductor transistor 11a, as shown in FIG. 19. Gate electrodes 21 are disposed over the substrate 13 to correspond to the polysilicon transistor 11n. The gate electrode 21 is disposed over the substrate 13 to correspond to the metal oxide semiconductor transistor 11a. A buffer layer 15 is disposed over the gate electrodes 21 and the substrate 13, and a buffer layer 19a is disposed over the buffer layer 15. A polysilicon layer 17 (such as a source region 17s, a channel region 17c, and a drain region 17d) is disposed over the buffer layer 19a. A buffer layer 19b is disposed over the polysilicon layer 17 and the buffer layer 19a. A source line 29L1, a drain line 29L2, a source electrode 29s, and a drain electrode 29d are disposed over the buffer layer 19b. The source line 29L1 is disposed over the source region 17s, and the source line 29L1 is connected to the source region 17s by a via 29h penetrating through the buffer layer 19b. The drain line 29L2 is disposed over the drain region 17d, and the drain line 29L2 is connected to the drain region 17d by a via 29h penetrating through the buffer layer 19b. The source electrode 29s and the drain electrode 29d are disposed over both sides of the metal oxide semiconductor layer 27. The buffer layers 19a and 19b have an opening 33 to correspond to the aperture region 11o. The above embodiments can be referred to for details of the other elements such as the pixel electrode and the common electrode. The silicon oxide layers (e.g. the buffer layers 19a and 19b) in the gate insulating layer between the metal oxide semiconductor layer 27 and the gate electrode 21 have an opening 33 corresponding to the aperture region 11o, as shown in FIG. 19. As such, the number of the interface between the silicon oxide layer and the silicon nitride layer in the aperture region 11o can be reduced, thereby improving the light transmittance of the array substrate structure.

Figure 20:
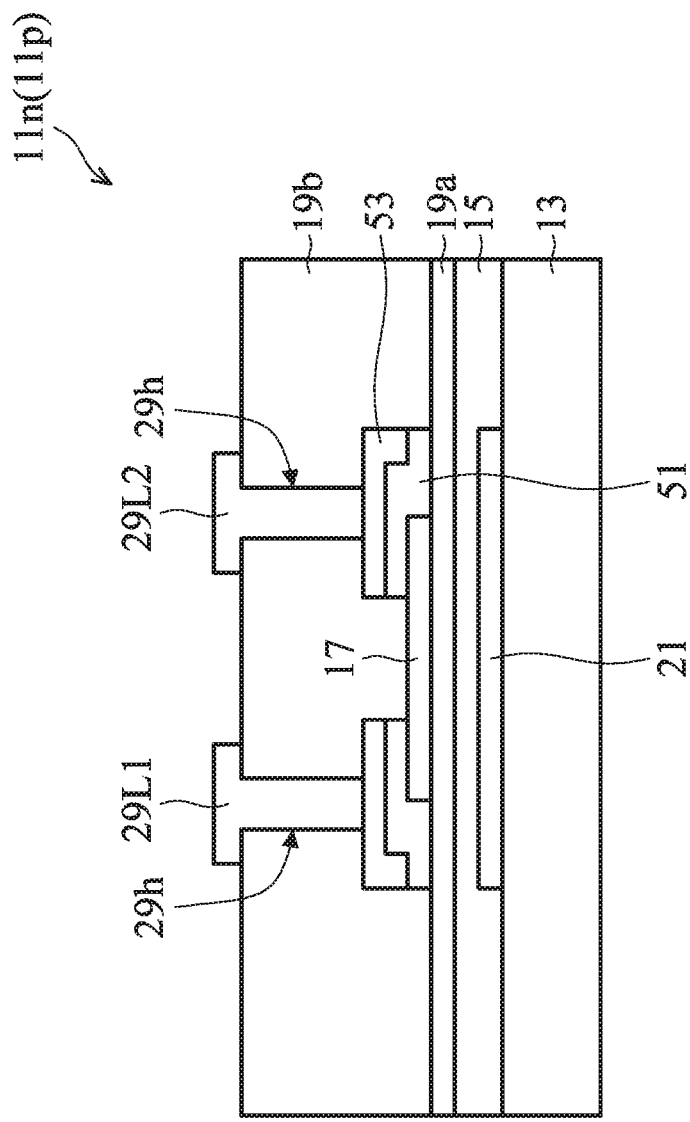
FIG. 20 shows a cross-sectional view of a polysilicon transistor and a metal oxide semiconductor transistor utilizing bottom gate structures in one embodiment of the disclosure.

In one embodiment, both sides of the polysilicon layer 17 of the polysilicon transistor 11n (or 11p) can be covered by amorphous silicon layers 51, and doped silicon layers 53 are disposed over the amorphous silicon layers 51, as shown in FIG. 20.

Figure 21:
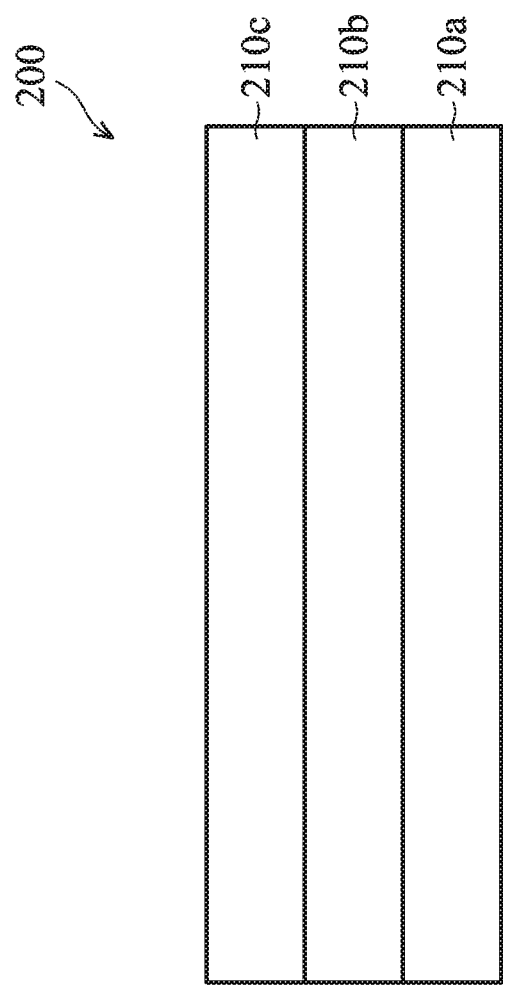
FIG. 21 shows a display device in one embodiment of the disclosure.

In one embodiment, as shown in FIG. 21, a display device 200 includes an array substrate structure 210a, an opposite substrate structure 210c, and a display medium 210b disposed therebetween. The array substrate structure can by any one of the array substrate structure in the above embodiments. The display medium 210b can be liquid crystals (LC), organic light-emitting diodes (OLED), micro light-emitting diodes (micro LED), quantum dot (QD) or other display elements, and is not limited thereto. The opposite substrate structure 210c can be a color filter substrate or a transparent substrate, and is not limited thereto. The display device can be a flexible display, a touch display, or a curved display, and is not limited thereto.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
    a substrate comprising a pixel region and a driving circuit, wherein the pixel region is disposed adjacent to the driving circuit;
    a metal oxide semiconductor transistor disposed over the substrate and comprising:
    a metal oxide semiconductor layer,
    a first gate electrode overlapping with the metal oxide semiconductor layer; and
    a gate insulating layer disposed between the metal oxide semiconductor layer and the first gate electrode, and the gate insulating layer having a first opening, wherein the first opening and the pixel region overlap;
    a second insulating layer disposed over the metal oxide semiconductor layer and having a via and a second opening, wherein the second opening and the first opening overlap; and
    a pixel electrode electrically connected to the metal oxide semiconductor layer through the via.

2. The display device as claimed in claim 1, wherein the first opening further extends beyond the pixel region.

3. The display device as claimed in claim 2, wherein the first opening is adjacent to the driving circuit.

4. The display device as claimed in claim 1, further comprises a third insulating layer over the second insulating layer and in the second opening.

5. The display device as claimed in claim 4, wherein the third insulating layer is in contact with a sidewall of the second opening.

6. The display device as claimed in claim 4, wherein the third insulating layer is in contact with the substrate.

7. The display device as claimed in claim 1, further comprising a thin film transistor adjacent to the first opening.

8. The display device as claimed in claim 7, wherein the thin film transistor is a polysilicon transistor.

9. The display device as claimed in claim 8, further comprising a second gate electrode overlapping with a polysilicon layer of the polysilicon transistor.

10. The display device as claimed in claim 9, wherein the second gate electrode is disposed over the polysilicon layer.

11. The display device as claimed in claim 9, wherein the polysilicon layer is disposed over the second gate electrode.

12. The display device as claimed in claim 1, wherein the first gate electrode is disposed over the metal oxide semiconductor layer.

13. The display device as claimed in claim 1, wherein the metal oxide semiconductor layer is disposed over the first gate electrode.

14. The display device as claimed in claim 1, further comprising a source electrode and a drain electrode electrically connected to the metal oxide semiconductor layer.

15. The display device as claimed in claim 1, further comprising a shielding layer, wherein the metal oxide semiconductor layer overlaps the shielding layer.

16. The display device as claimed in claim 1, further comprising a display medium on the substrate.

17. The display device as claimed in claim 16, wherein the display medium comprises organic light-emitting diode, micro light-emitting diode, or quantum dot.

18. The display device as claimed in claim 1, being a flexible device.

* * * * *